United States Patent
Zeng et al.

(10) Patent No.: US 12,408,292 B2
(45) Date of Patent: Sep. 2, 2025

(54) WIRELESS CHARGER

(71) Applicant: Huawei Digital Power Technologies Co., Ltd., Shenzhen (CN)

(72) Inventors: Miaomiao Zeng, Dongguan (CN); Chao Yang, Dongguan (CN); Zhipeng Guan, Shenzhen (CN); Yong Wang, Dongguan (CN); Zhao Wang, Dongguan (CN); Yanan Gong, Dongguan (CN); Li He, Dongguan (CN); Guli Zhu, Shenzhen (CN); Tong Gu, Chengdu (CN); Xiaozhen Li, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 244 days.

(21) Appl. No.: 18/347,831

(22) Filed: Jul. 6, 2023

(65) Prior Publication Data
US 2024/0015923 A1  Jan. 11, 2024

(30) Foreign Application Priority Data

Jul. 7, 2022 (CN) .......................... 202210795078.1

(51) Int. Cl.
*H05K 7/20* (2006.01)
*H02J 50/00* (2016.01)

(52) U.S. Cl.
CPC ........ *H05K 7/20154* (2013.01); *H02J 50/005* (2020.01)

(58) Field of Classification Search
CPC .................... H05K 7/20154; H02J 50/005
See application file for complete search history.

(56) References Cited

U.S. PATENT DOCUMENTS 11,317,544 B1 * 4/2022 Zeng ........................ H02K 1/20

FOREIGN PATENT DOCUMENTS

| CN | 207234482 U | * 4/2018 | ............... H02J 7/00 |
| CN | 209217759 U |   8/2019 |   |
| CN | 209497287 U | * 10/2019 |   |
| CN | 112311048 A |   2/2021 |   |
| CN | 112383153 A | * 2/2021 | ............... F25B 21/02 |

OTHER PUBLICATIONS

CN 112383153 A Eng translation (Year: 2021).*
CN 207234482 U Eng translation (Year: 2018).*
CN 209497287 U, Eng translation (Year: 2019).*

* cited by examiner

*Primary Examiner* — Mukundbhai G Patel
(74) *Attorney, Agent, or Firm* — Maier & Maier, PLLC

(57) ABSTRACT

A wireless charger includes an upper housing assembly, a lower housing assembly, a magnetic sheet coil, and a heat dissipation ring. A concave structure is provided on an upper surface of the lower housing assembly, and the concave structure is coupled to the upper housing assembly to form a cavity structure. The cavity structure accommodates the magnetic sheet coil and the heat dissipation ring. The heat dissipation ring is embedded in the magnetic sheet coil and is in contact with the magnetic sheet coil. An upper surface of the heat dissipation ring is coupled to the upper housing assembly. A lower surface of the heat dissipation ring is coupled to a bottom of the concave structure of the lower housing assembly. The heat dissipation ring may transfer heat in the upper housing assembly to the bottom of the lower housing assembly.

15 Claims, 9 Drawing Sheets

WIRELESS CHARGER

CROSS-REFERENCE TO RELATED APPLICATION

This application claims priority to Chinese Patent Application No. 202210795078.1, filed on Jul. 7, 2022, which is hereby incorporated by reference in its entirety.

TECHNICAL FIELD

The embodiments relate to the field of wireless charging technologies and a wireless charger.

BACKGROUND

With development of wireless charging technologies, an electronic device may be charged by using a wireless charger. The wireless charger converts electrical energy into a wireless charging signal and transmits the wireless charging signal to the to-be-charged electronic device, so as to implement a wireless charging function. The existing wireless charger has disadvantages such as being unsteady in structure, poor in internal heat dissipation, and slow in charging speed, which are not conducive to product promotion and use.

SUMMARY

To resolve the foregoing problem, the embodiments may provide a wireless charger, including an upper housing assembly, a lower housing assembly, a magnetic sheet coil, and a heat dissipation ring. A concave structure is provided on an upper surface of the lower housing assembly, and the concave structure is coupled to the upper housing assembly to form a cavity structure. The cavity structure accommodates the magnetic sheet coil and the heat dissipation ring. The heat dissipation ring is embedded in the magnetic sheet coil and is in contact with the magnetic sheet coil. An upper surface of the heat dissipation ring is coupled to the upper housing assembly. A lower surface of the heat dissipation ring is coupled to a bottom of the concave structure of the lower housing assembly. When heat in an electronic device is transferred to the upper housing assembly, the heat dissipation ring may transfer heat in the upper housing assembly to the bottom of the lower housing assembly, so that a heat dissipation area of the electronic device is increased, and heat dissipation capabilities of the wireless charger and the electronic device are improved.

The embodiments may provide a wireless charger, including an upper housing assembly, a lower housing assembly, a magnetic sheet coil, and a heat dissipation ring, where a concave structure is provided on an upper surface of the lower housing assembly, the concave structure is coupled to the upper housing assembly to form a cavity structure, the magnetic sheet coil is sleeved outside the heat dissipation ring, and a gap among the upper housing assembly, the concave structure, the magnetic sheet coil, and the heat dissipation ring is filled with a thermally conductive adhesive. An upper surface of the heat dissipation ring is coupled to a lower surface of the upper housing assembly, a lower surface of the heat dissipation ring is coupled to a bottom of the concave structure of the lower housing assembly, and an outer side surface of the heat dissipation ring is coupled to the magnetic sheet coil. The upper surface of the heat dissipation ring is a surface that is of the heat dissipation ring and that is close to the upper housing assembly, the lower surface of the heat dissipation ring is a surface that is of the heat dissipation ring and that is close to the bottom of the concave structure of the lower housing assembly, and the lower surface of the upper housing assembly is a surface that is of the upper housing assembly and that constitutes the cavity structure. The heat dissipation ring is configured to conduct heat of the upper housing assembly and the magnetic sheet coil to the bottom of the concave structure of the lower housing assembly.

In an implementation, a limiting magnet is further included, where the limiting magnet is disposed inside the heat dissipation ring, an upper surface of the limiting magnet is coupled to the lower surface of the upper housing assembly, and a lower surface of the limiting magnet is coupled to the bottom of the concave structure of the lower housing assembly. The upper surface of the limiting magnet is a surface that is of the limiting magnet and that is close to the upper housing assembly, and the lower surface of the limiting magnet is a surface that is of the limiting magnet and that is close to the bottom of the concave structure of the lower housing assembly. The limiting magnet is configured to transfer heat of the upper housing assembly to the bottom of the concave structure of the lower housing assembly.

In an implementation, a thermally conductive adhesive is provided between the upper surface of the limiting magnet and the lower surface of the upper housing assembly, and a thermally conductive adhesive is provided between the lower surface of the limiting magnet and the bottom of the concave structure of the lower housing assembly.

In an implementation, a thermally conductive adhesive is provided between the heat dissipation ring and the limiting magnet.

In an implementation, a thermally conductive adhesive is provided between the upper surface of the heat dissipation ring and the upper housing assembly, and a thermally conductive adhesive is provided between the lower surface of the heat dissipation ring and the bottom of the concave structure of the lower housing assembly.

In an implementation, the magnetic sheet coil is coupled to the lower surface of the upper housing assembly, and a thermally conductive adhesive is provided between the magnetic sheet coil and the lower surface of the upper housing assembly.

In an implementation, the magnetic sheet coil includes a magnetic sheet assembly and a coil assembly, a circular groove is provided in the magnetic sheet assembly to accommodate the coil assembly, and a thermally conductive adhesive is provided in the circular groove of the magnetic sheet assembly.

In an implementation, the heat dissipation ring is made of a high thermally conductive material.

In an implementation, the upper housing assembly is made of a high thermally conductive material. When the wireless charger wirelessly charges an electronic device, the upper housing assembly conducts heat of the electronic device to the lower housing assembly by using the heat dissipation ring.

In an implementation, the upper housing assembly conducts the heat of the electronic device to the lower housing assembly.

In an implementation, the upper housing assembly conducts the heat of the electronic device to the lower housing assembly by using the thermally conductive adhesive.

In an implementation, the heat dissipation ring conducts heat of the magnetic sheet coil to the lower housing assembly.

In an implementation, the limiting magnet conducts the heat of the magnetic sheet coil to the lower housing assembly.

In an implementation, the thermally conductive adhesive conducts the heat of the magnetic sheet coil to the lower housing assembly and the upper housing assembly.

In an implementation, the concave structure includes a coil supporting plane, the magnetic sheet coil is disposed on the coil supporting plane, and the coil supporting plane conducts the heat of the magnetic sheet coil to the lower housing assembly.

BRIEF DESCRIPTION OF THE DRAWINGS

The following briefly describes the accompanying drawings that need to be used in the descriptions of the embodiments or a conventional technology.

DETAILED DESCRIPTION OF THE EMBODIMENTS

The following describes the embodiments with reference to the accompanying drawings.

In the descriptions, locations or position relationships indicated by terms "center", "up", "down", "in front of", "behind", "left", "right", "vertical", "horizontal", "top", "bottom", "inside", "outside", and the like are based on locations or position relationships shown in the accompanying drawings, and may be intended for ease of describing the embodiments and simplifying descriptions, instead of indicating or implying that a mentioned apparatus or component needs to be provided on a location or constructed and operated on a location, and therefore shall not be understood as limitations.

In the descriptions, it should be noted that, unless otherwise clearly specified and limited, terms "mount", "link", and "connect" should be understood in a broad sense, for example, may mean a fixed connection, may be a detachable connection, or may be a butt joint connection or an integrated connection. Persons of ordinary skill in the art can understand meanings of the foregoing terms. In the embodiments, "contact" or "coupling" may mean direct contact between components or may mean contact between components by using a bonding agent or a thermally conductive adhesive.

In the descriptions, the described features, structures, materials, or characteristics may be combined in a proper manner in any one or more of embodiments or examples.

Figure 1:
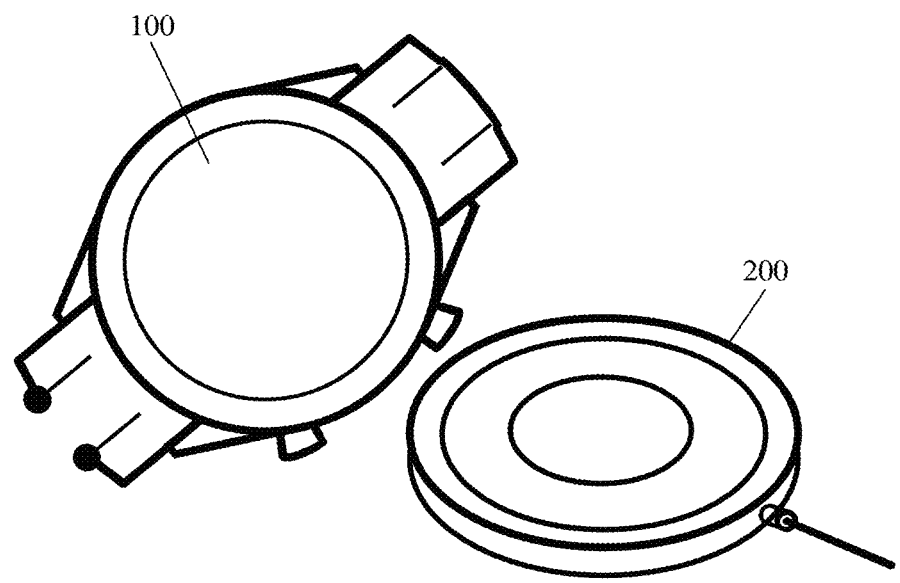
FIG. 1 is a schematic diagram of a scenario in which a wireless charger charges an electronic device according to an embodiment.

FIG. 1 is a schematic diagram of a scenario in which a charger charges an electronic device according to an embodiment. An electronic device 100 may be an electronic watch, a smartphone, a wireless headset, a tablet computer, a notebook computer, or the like. A wireless charger 200 may be a portable wireless charger, an in-vehicle wireless charger, or the like. During wireless charging, the electronic device 100 may be disposed on an upper surface of the wireless charger 200, or a distance between the electronic device 100 and the wireless charger 200 is less than or equal to a charging distance. The wireless charger 200 converts electrical energy into a wireless charging signal. After receiving the wireless charging signal, the electronic device 100 converts the wireless charging signal into electrical energy, to supply power to the electronic device 100.

In this embodiment, when the wireless charger 200 is disposed on a desktop, the "upper surface" is a surface that is of the wireless charger 200 and that is away from the desktop. The upper surface of the wireless charger 200 may be a substrate configured to carry the electronic device 100 or may be a housing of the wireless charger 200 or another structural part. In this embodiment, the surface may be a plane or a curved surface. By analogy, an upper surface of each component in the wireless charger 200 is a surface that is of the component and that is away from the desktop. A "lower surface" is a surface opposite to the "upper surface".

In this embodiment, "facing upward" means a direction pointing from the wireless charger 200 to the electronic device 100 during wireless charging. "Facing downward" is an opposite direction of "facing upward".

Figure 2:
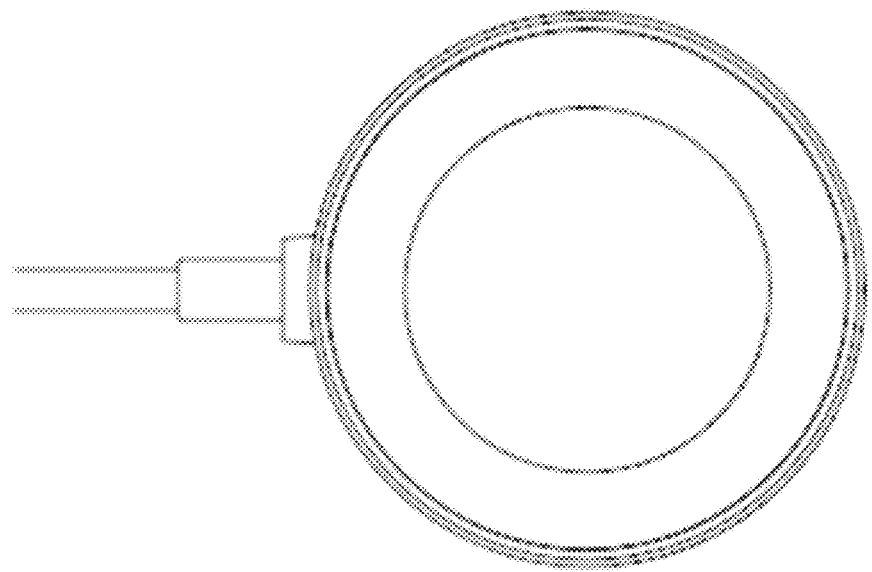
FIG. 2 is a schematic diagram of a top-view structure of a wireless charger according to an embodiment.
Figure 3:
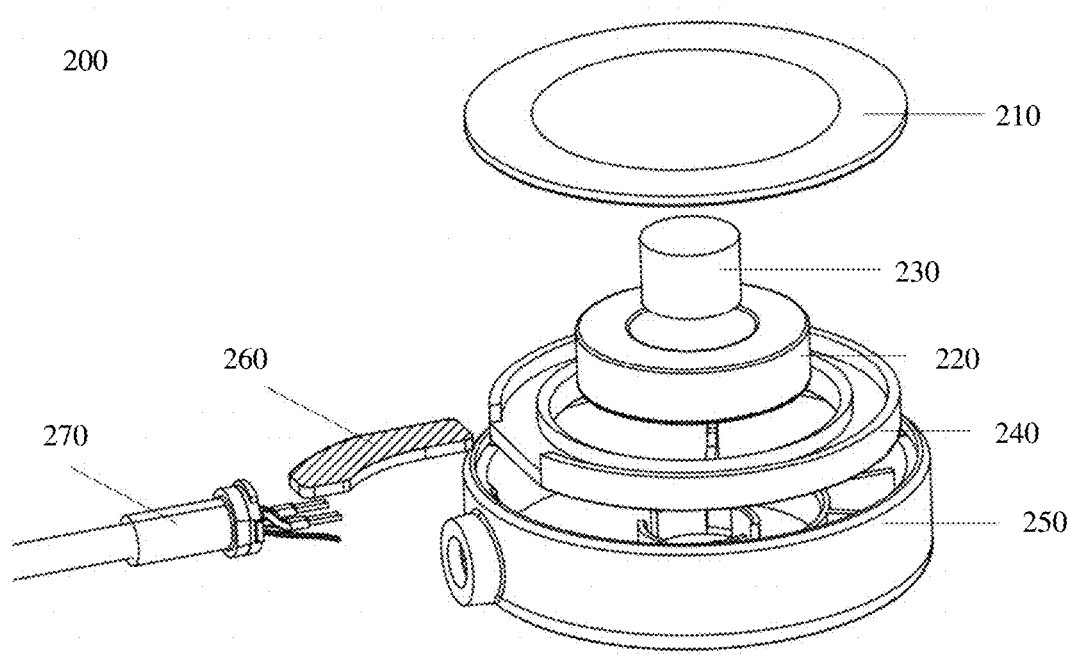
FIG. 3 is an exploded diagram of a structure of a wireless charger according to an embodiment.
Figure 4:
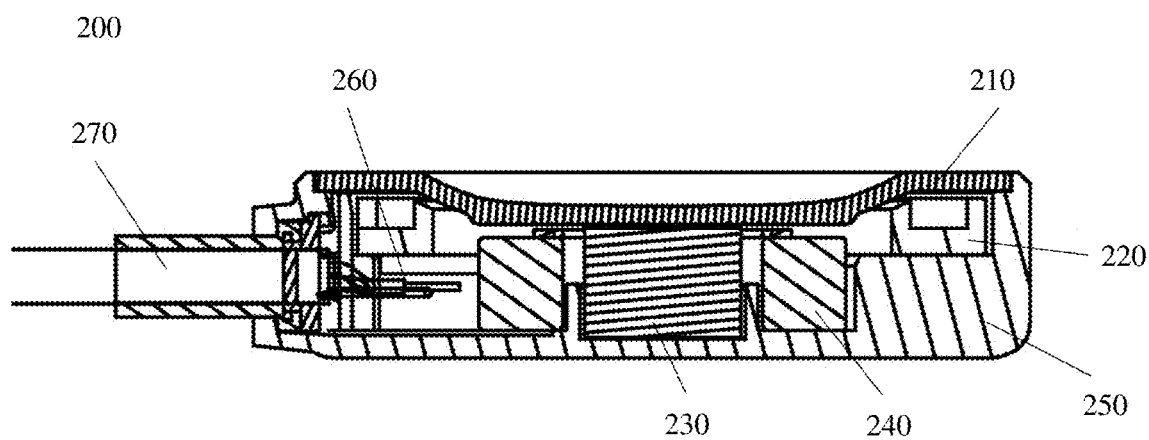
FIG. 4 is a schematic diagram of a cross-sectional structure of a wireless charger according to an embodiment.

FIG. 2 to FIG. 4 are schematic diagrams of a wireless charger according to an embodiment. As shown in FIG. 2 to FIG. 4, a wireless charger 200 is in a shape of a cylinder. In another embodiment, the wireless charger 200 may alternatively be in another shape such as an elliptic cylinder or a polygonal column.

As shown in FIG. 3, the wireless charger 200 includes an upper housing assembly 210, a magnetic sheet coil 220, a limiting magnet 230, a heat dissipation ring 240, a lower housing assembly 250, a circuit board 260, and a cable 270. The upper housing assembly 210 is coupled to the lower housing assembly 250 to form a housing of the wireless charger 200. A concave structure is provided on an upper surface of the lower housing assembly 250. After the upper housing assembly 210 is coupled to the concave structure of the lower housing assembly 250, a cavity structure is formed between the upper housing assembly 210 and the lower housing assembly 250. The cavity structure is used to accommodate the magnetic sheet coil 220, the limiting magnet 230, the heat dissipation ring 240, and the circuit board 260. The lower housing assembly 250 is provided with a through hole, which enables the cable 270 to enter the cavity structure. The cable 270 is electrically connected to the circuit board 260.

As shown in FIG. 3, top-view shapes of the upper housing assembly 210, the limiting magnet 230, and the lower housing assembly 250 are round shapes, and top-view shapes of the magnetic sheet coil 220 and the heat dissipation ring 240 are circular ring shapes. In this embodiment, the top-view shape of the lower housing assembly 250 is related to a shape of the wireless charger 200. The overall shape of the wireless charger 200 is a cylinder, and the lower housing assembly 250 is in a shape of a cylinder. The upper housing assembly 210, the magnetic sheet coil 220, the limiting magnet 230, the heat dissipation ring 240, and the lower housing assembly 250 may be in other shapes.

The concave structure is provided on the upper surface of the lower housing assembly 250. The upper housing assembly 210 is coupled at an outlet of the concave structure of the lower housing assembly 250, and the cavity structure is formed between the upper housing assembly 210 and the lower housing assembly 250. The cavity structure is used to accommodate components such as the magnetic sheet coil 220, the limiting magnet 230, the heat dissipation ring 240, and the circuit board 260.

As shown in FIG. 3, a top-view shape of the concave structure of the lower housing assembly 250 is a round shape. In another embodiment, the top-view shape of the concave structure of the lower housing assembly 250 may alternatively be another shape such as a rectangle, an ellipse, or a polygon. A radius of the concave structure of the lower housing assembly 250 is equal to or slightly greater than a radius of the upper housing assembly 210. The upper housing assembly 210 is disposed at the outlet of the concave structure of the lower housing assembly 250, the upper housing assembly 210 is embedded into the concave structure of the lower housing assembly 250, and an upper surface of the upper housing assembly 210 and the upper surface of the lower housing assembly 250 are on a same plane.

In an embodiment, the lower housing assembly 250 includes a side plate and a bottom plate. In this embodiment, the wireless charger 200 is in a shape of a cylinder, the side plate of the lower housing assembly 250 is in a shape of a toroidal column, and the bottom plate of the lower housing assembly 250 is in a shape of a round plate. In another embodiment, the bottom plate of the lower housing assembly 250 is in a shape the same as that of the upper housing assembly 210.

In an assembly process, the bottom plate of the lower housing assembly 250 is fastened to an opening on one side of the side plate of the lower housing assembly 250, to form the lower housing assembly 250 with the concave structure. The upper housing assembly 210 is fastened to an opening on the other side of the side plate of the lower housing assembly 250. The upper housing assembly 210, the side plate of the lower housing assembly 250, and the bottom plate of the lower housing assembly 250 constitute the cavity structure. In this embodiment, the lower housing assembly 250 is split into two parts: the bottom plate and the side plate, and may be divided into two components for manufacturing, so that a manufacturing difficulty of the lower housing assembly 250 is reduced.

Figure 5:
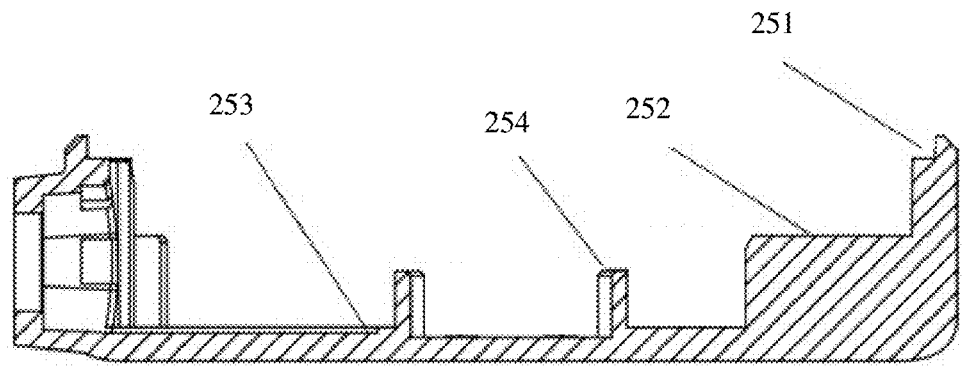
FIG. 5 is a schematic diagram of a concave structure of a lower housing assembly of a wireless charger according to an embodiment.
Figure 6:
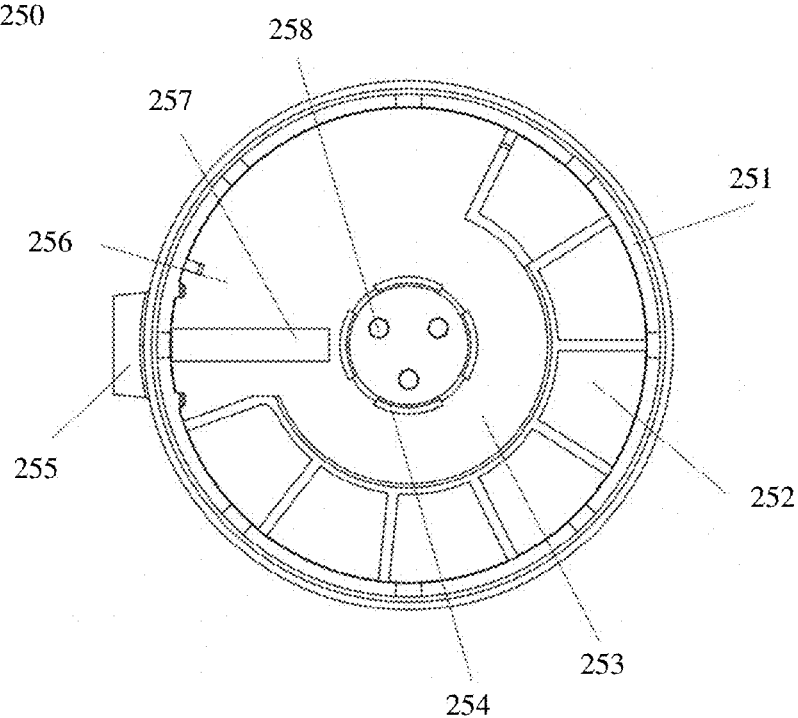
FIG. 6 is a schematic diagram of a top-view structure of a lower housing assembly of a wireless charger according to an embodiment.

FIG. 5 and FIG. 6 are schematic diagrams of a lower housing assembly of a wireless charger according to an embodiment. A plurality of supporting planes may be provided in the concave structure of the lower housing assembly 250 of the wireless charger 200 provided in this embodiment, and are respectively used to support a plurality of components of the upper housing assembly 210, the magnetic sheet coil 220, the limiting magnet 230, the heat dissipation ring 240, or the circuit board 260.

The upper housing assembly 210, the magnetic sheet coil 220, the limiting magnet 230, the heat dissipation ring 240, or the circuit board 260 is in contact with the plurality of supporting planes of the lower housing assembly 250 respectively, and the lower housing assembly 250 transfers heat to gas outside of the wireless charger 200, so that a heat dissipation capability of the wireless charger 200 is improved.

As shown in FIG. 5, an upper housing supporting plane 251 is provided on an inner side wall of the concave structure of the lower housing assembly 250. The upper housing supporting plane 251 is close to the upper surface of the lower housing assembly 250 and is close to an opening of the concave structure of the lower housing assembly 250. The upper housing supporting plane 251 is used to support the upper housing assembly 210.

In this embodiment, a depth of the upper housing supporting plane 251 is a distance between the upper housing supporting plane 251 and the upper surface of the lower housing assembly 250.

In an embodiment, the depth of the upper housing supporting plane 251 is equal to a thickness of the upper housing assembly 210. The upper housing supporting plane 251 supports the upper housing assembly 210, and the upper surface of the upper housing assembly 210 and the upper surface of the lower housing assembly 250 are on a same plane.

In another embodiment, the depth of the upper housing supporting plane 251 may be slightly greater than the thickness of the upper housing assembly 210. Correspondingly, a bonding agent may be added between the upper housing assembly 210 and the upper housing supporting plane 251, and the upper surface of the upper housing assembly 210 and the upper surface of the lower housing assembly 250 are on a same plane. The upper surface of the upper housing assembly 210 and the upper surface of the lower housing assembly 250 are on a same plane, so that the upper surface of the wireless charger 200 is flat, which helps the upper surface of the wireless charger 200 support an electronic device.

In this embodiment, a width of the upper housing supporting plane 251 is a difference between an inner radius and an outer radius of the upper housing supporting plane 251. In an embodiment, the inner radius of the upper housing supporting plane 251 is less than the radius of the upper housing assembly 210. The upper housing assembly 210 is disposed in the concave structure of the lower housing assembly 250, and the upper housing supporting plane 251 supports the upper housing assembly 210. In an embodiment, the inner radius of the upper housing supporting plane 251 is greater than an outer radius of the magnetic sheet coil 220. The magnetic sheet coil 220 is disposed in the concave structure of the lower housing assembly 250, and the magnetic sheet coil 220 may pass through the upper housing supporting plane 251.

As shown in FIG. 5, a coil supporting plane 252 may be further provided in the concave structure of the lower housing assembly 250. The coil supporting plane 252 is used to support the magnetic sheet coil 220. The coil supporting plane 252 is located between the upper housing supporting plane 251 and the bottom of the concave structure of the lower housing assembly 250. The coil supporting plane 252 supports the magnetic sheet coil 220, and a gap between the bottom of the concave structure of the lower housing assembly 250 and the magnetic sheet coil 220 is used to accommodate the circuit board 260.

In this embodiment, a depth of the coil supporting plane 252 is a distance between the coil supporting plane 252 and the upper surface of the lower housing assembly 250. The depth of the coil supporting plane 252 is greater than or equal to a sum of a thickness of the magnetic sheet coil 220 and the thickness of the upper housing assembly 210.

In an embodiment, a distance between the coil supporting plane 252 and the upper housing supporting plane 251 is slightly greater than the thickness of the magnetic sheet coil 220. The upper housing assembly 210 and the magnetic sheet coil 220 are disposed in the concave structure of the lower housing assembly 250, and there is a gap between the upper housing assembly 210 and the magnetic sheet coil 220. The gap between the upper housing assembly 210 and the magnetic sheet coil 220 may be filled with a thermally conductive adhesive. The upper housing assembly 210, the magnetic sheet coil 220 and the coil supporting plane 252 may constitute a longitudinal limiting structure. In addition, the upper surface of the upper housing assembly 210 is deformed due to an external force, and deformation of the upper housing assembly 210 does not squeeze the magnetic sheet coil 220, so as to avoid damage to the magnetic sheet coil 220.

In an embodiment, the distance between the coil supporting plane 252 and the upper housing supporting plane 251 is equal to the thickness of the magnetic sheet coil 220. Correspondingly, the upper housing assembly 210, the magnetic sheet coil 220 and the coil supporting plane 252 may constitute a longitudinal limiting structure.

As shown in FIG. 6, a top-view shape of the coil supporting plane 252 is a partially annular shape. In an embodiment, a circular sector angle corresponding to the coil supporting plane 252 is greater than or equal to 180 degrees.

In this embodiment, a width of the coil supporting plane 252 is a difference between an inner radius and an outer radius of the coil supporting plane 252. The outer radius of the magnetic sheet coil 220 is greater than or equal to the inner radius of the coil supporting plane 252. In an embodiment, the outer radius of the coil supporting plane 252 is equal to the inner radius of the upper housing supporting plane 251. In an embodiment, the inner radius of the coil supporting plane 252 is greater than an outer radius of the heat dissipation ring 240, the outer radius of the heat dissipation ring 240 is not greater than an inner radius of the magnetic sheet coil 220, and the heat dissipation ring 240 may pass through the magnetic sheet coil 220 and the coil supporting plane 252. The magnetic sheet coil 220 is sleeved on the heat dissipation ring 240.

As shown in FIG. 6, the coil supporting plane 252 is formed by using a fence-shaped support body. The fence-shaped support body is provided on the bottom of the concave structure of the lower housing assembly 250, and an upper surface of the fence-shaped support body is the coil supporting plane 252. The fence-shaped support body is fixedly connected to the bottom and the inner side wall of the concave structure of the lower housing assembly 250. In an embodiment, the lower housing assembly 250 includes a fence-shaped support body, and the fence-shaped support body includes one arc-shaped fence and a plurality of column-shaped fences. The arc-shaped fence is fastened on the bottom of the concave structure of the lower housing assembly 250, and the arc-shaped fence is parallel to the inner side wall of the concave structure of the lower housing assembly 250. The plurality of column-shaped fences may be fastened on the bottom of the concave structure of the lower housing assembly 250. Each column-shaped fence is connected between the inner side wall of the concave structure of the lower housing assembly 250 and the arc-shaped fence. The plurality of column-shaped fences may provide radial support for the arc-shaped fence. The heat dissipation ring 240 is mounted in the concave structure of the lower housing assembly 250. Under the action of a radial support force provided by the plurality of column-shaped fences, a position of the coil supporting plane 252 does not change due to extrusion of the heat dissipation ring 240.

In an embodiment, the arc-shaped fence and the column-shaped fences of the fence-shaped support body are of a same height, so that a supporting plane of the coil supporting plane 252 is flat. The magnetic sheet coil 220 is disposed on the coil supporting plane 252, so that damage caused by an uneven force on the magnetic sheet coil 220 can be avoided.

In an embodiment, the plurality of column-shaped fences may be provided between the inner side wall of the concave structure of the lower housing assembly 250 and the arc-shaped fence at an equal spacing. In another embodiment, the plurality of column-shaped fences may be provided between the inner side wall of the concave structure of the lower housing assembly 250 and the arc-shaped fence in another arrangement manner.

In an embodiment, the plurality of column-shaped fences may be separated, and a gap is formed among the column-shaped fences, the arc-shaped fence, and the inner side wall of the concave structure of the lower housing assembly 250f and is used to be filled with a thermally conductive adhesive. Correspondingly, heat generated by the magnetic sheet coil 220 may not only be transferred to the lower housing assembly 250 by using the fence-shaped support body of the coil supporting plane 252, but also be transferred to the lower housing assembly 250 by using the thermally conductive adhesive, so that a heat dissipation capability of the wireless charger 200 is improved.

The coil supporting plane 252 of the wireless charger 200 provided in this embodiment is formed by using the fence-shaped support body, so that a material for manufacturing the lower housing assembly 250 can be reduced, thereby reducing costs and a weight of the wireless charger 200. In addition, the coil supporting plane 252 is formed by using the fence-shaped support body, so that a watermark can be prevented from being formed on a lower surface of the lower housing assembly 250, thereby avoiding affecting an appearance of the wireless charger 200.

In this embodiment, the wireless charger 200 may further include the limiting magnet 230 and/or the heat dissipation ring 240. As shown in FIG. 5, a magnet supporting plane 253 may be further provided in the concave structure of the lower housing assembly 250. In this embodiment, a middle area of the bottom of the concave structure of the lower housing assembly 250 may be used as a supporting plane of the limiting magnet 230 and/or the heat dissipation ring 240, and the supporting plane is subsequently referred to as the magnet supporting plane 253.

In this embodiment, a depth of the magnet supporting plane 253 is a depth of the concave structure of the lower housing assembly 250. In an embodiment, a lower surface of the upper housing assembly 210 is flat, and the depth of the magnet supporting plane 253 is greater than a sum of a height of the limiting magnet 230 and the thickness of the upper housing assembly 210. In an embodiment, there is a protrusion structure on the lower surface of the upper housing assembly 210, and the depth of the magnet supporting plane 253 is greater than a sum of the height of the limiting magnet 230, the thickness of the upper housing assembly 210, and a height of the protrusion structure on the lower surface of the upper housing assembly 210.

In an embodiment, the lower surface of the upper housing assembly 210 is flat, and the depth of the magnet supporting plane 253 is greater than a sum of a height of the heat dissipation ring 240 and the thickness of the upper housing assembly 210.

In an embodiment, there is a protrusion structure on the lower surface of the upper housing assembly 210, and the depth of the magnet supporting plane 253 is greater than a sum of the height of the heat dissipation ring 240, the thickness of the upper housing assembly 210, and the height of the protrusion structure on the lower surface of the upper housing assembly 210.

In another embodiment, the height of the limiting magnet 230 is different from that of the heat dissipation ring 240, and a depth of a part supporting the limiting magnet 230 in the magnet supporting plane 253 may be different from a depth of a part supporting the heat dissipation ring 240.

In this embodiment, the limiting magnet 230 is of a columnar structure, and the magnetic sheet coil 240 is of an annular structure. The magnetic sheet coil 240 is disposed on the coil supporting plane 252. The limiting magnet 230 is disposed on the magnet supporting plane 253. At least a part of the limiting magnet 253 passes through the annular structure of the magnetic sheet coil 240.

In an embodiment, the limiting magnet 230 and the heat dissipation ring 240 are mounted in the concave structure of the lower housing assembly 250, there is a gap between the upper housing assembly 210 and the limiting magnet 230, and there is a gap between the upper housing assembly 210 and the heat dissipation ring 240. The upper surface of the upper housing assembly 210 is deformed due to an external force, and deformation of the upper housing assembly 210 does not squeeze the limiting magnet 230 and the heat dissipation ring 240, so as to avoid damage to the limiting magnet 230 and the heat dissipation ring 240. In an embodiment, the gap between the upper housing assembly 210 and the limiting magnet 230 and the gap between the upper housing assembly 210 and the heat dissipation ring 240 may be filled with a thermally conductive adhesive, to improve heat dissipation efficiency of the wireless charger 200.

Figure 7:
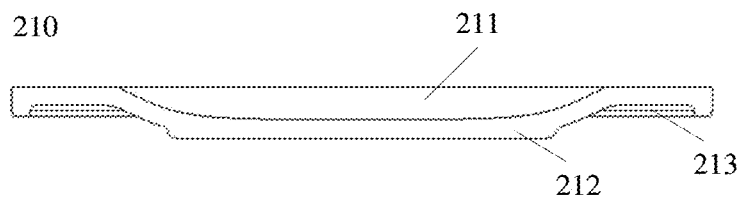
FIG. 7 is a schematic diagram of a structure of an upper housing assembly of a wireless charger according to an embodiment.

As shown in FIG. 7, an isolation plate 254 is provided on the magnet supporting plane 253 and is used to limit positions of the limiting magnet 230 and the heat dissipation ring 240. In an embodiment, the limiting magnet 230 is disposed on the magnet supporting plane 253, and the limiting magnet 230 is located on an inner side of the isolation plate 254. In an embodiment, the heat dissipation ring 240 is disposed between a side face of the fence-shaped support body of the coil supporting plane 252 and the isolation plate 254. The isolation plate 254 is provided between the limiting magnet 230 and the heat dissipation ring 240, so as to avoid a case in which a volume of the heat dissipation ring 240 becomes larger after the heat dissipation ring 240 absorbs heat, and an extrusion pressure generated by the heat dissipation ring 240 damages the limiting magnet 230.

In this embodiment, a shape of the isolation plate 254 is related to space reserved between the limiting magnet 230 and the heat dissipation ring 240 and may be another shape such as an ellipse or a polygon. This is not limited. In an embodiment, a top-view shape of the limiting magnet 230 is a round shape, a top-view shape of the heat dissipation ring 240 is a circular ring shape, and a top-view shape of the isolation plate 254 is a circular ring shape. An inner radius of the isolation plate 254 is greater than or equal to a radius of the limiting magnet 230, and an outer radius of the isolation plate 254 is less than or equal to an inner radius of the heat dissipation ring 240. In an embodiment, the magnet supporting plane 253 is provided with an annular protrusion 254, which is used to isolate the limiting magnet 230 from the heat dissipation ring 240. In an embodiment, the magnet supporting plane 253 is provided with an annular isolation plate 254, which is used to isolate the limiting magnet 230 from the heat dissipation ring 240.

As shown in FIG. 4, a receiving cavity is formed among the magnetic sheet coil 220, the bottom of the concave structure of the lower housing assembly 250, the inner side wall of the concave structure of the lower housing assembly 250, and the heat dissipation ring 240, and is used to accommodate the circuit board 260 and the cable 270. A top-view shape of the receiving cavity and the top-view shape of the coil supporting plane 252 constitute a circular ring shape.

A part that is of the bottom of the concave structure of the lower housing assembly 250 and that constitutes the receiving cavity is a circuit board supporting plane 256. The circuit board supporting plane 256 is located on the bottom of the concave structure of the lower housing assembly 250 and is located at an edge of the bottom of the concave structure of the lower housing assembly 250. The circuit board supporting plane 256 is used to support the circuit board 260. As shown in FIG. 6, the circuit board supporting plane 256 is located on the bottom of the concave structure of the lower housing assembly 250 and is located at an edge of the magnet supporting plane 253. A top-view shape of the circuit board supporting plane 256 and the top-view shape of the coil supporting plane 252 constitute a circular ring shape.

A through hole 255 is provided on the inner side wall that is of the concave structure of the lower housing assembly 250 and that corresponds to the receiving cavity. A wiring trough 257 is provided on the bottom that is of the concave structure of the lower housing assembly 250 and that corresponds to the receiving cavity. The wiring trough 257 is communicated with the through hole 255. A wire of the circuit board 260 is connected to an external circuit by using the wiring trough 257 and the through hole 255.

In this embodiment, a depth of the circuit board supporting plane 256 is a distance between a plane on which the circuit board supporting plane 256 is located and the upper surface of the lower housing assembly 250. In an embodiment, the lower surface of the upper housing assembly 210 is flat, and the depth of the circuit board supporting plane 256 is greater than a sum of the thickness of the upper housing assembly 210, the thickness of the magnetic sheet coil 220, and a thickness of the circuit board 260.

In an embodiment, there is a protrusion structure on the lower surface of the upper housing assembly 210, and the depth of the circuit board supporting plane 256 is greater than a sum of the thickness of the upper housing assembly 210, a height of the protrusion structure on the lower surface of the upper housing assembly 210, the thickness of the magnetic sheet coil 220, and the thickness of the circuit board 260.

In an embodiment, the depth of the circuit board supporting plane 256 may be different from that of the magnet supporting plane 253.

In an embodiment, a height difference between the circuit board supporting plane 256 and the coil supporting plane 252 is equal to or slightly greater than the thickness of the circuit board 260. After the circuit board 260 and the magnetic sheet coil 220 are respectively disposed on the circuit board supporting plane 256 and the coil supporting plane 252, there is a gap between the circuit board 260 and the magnetic sheet coil 220, so as to prevent the circuit board 260 from being damaged by an extrusion pressure generated by the magnetic sheet coil 220.

As shown in FIG. 6, the lower housing assembly 250 is provided with the through hole 255. The cable 270 may pass through the through hole 255 and enter the concave structure of the lower housing assembly 250. The cable 270 may be electrically connected to the circuit board 260, so that the circuit board 260 provides electrical energy for the wireless charger 200. The through hole 255 is located on the inner side wall of the concave structure of the lower housing assembly 250 and is located on a part that is of the inner side wall of the concave structure of the lower housing assembly 250 and that constitutes the receiving cavity. In another embodiment, a shape of the through hole 255 may be a round shape, an ellipse, or another shape. This is not limited.

As shown in FIG. 6, the circuit board supporting plane 256 is provided with the wiring trough 257. The through hole 255 is located on the bottom of the concave structure of the lower housing assembly 250 and is located at a part that is of the concave structure of the lower housing assembly 250 and that constitutes the receiving cavity. The wiring trough 257 is communicated with the through hole 255, and a wire of the circuit board 260 is connected to an external circuit by using the wiring trough 257 and the through hole 255. the circuit board 260 may be an independent component. The circuit board 260 is electrically connected to the cable 270, and the cable 270 is welded to an endpoint on a surface of the circuit board 260, which causes a protrusion on the surface of the circuit board 260. The circuit board 260 is disposed on the circuit board supporting plane 256, and the protrusion of the circuit board 260 and the cable 270 are trapped in the wiring trough 257, so that the circuit board 260 is better disposed on the circuit board supporting plane 256.

In an embodiment, a central axis of the through hole 255 and a central axis of the wiring trough 257 are in a straight line. In an embodiment, the central axis of the through hole 255 and the central axis of the wiring trough 257 are not in a straight line, and the cable 270 needs to be bent, so as to dispose the circuit board 260 on the circuit board supporting plane 256. The cable 270 is easy to break after being bent, which reduces reliability of the wireless charger 200. Further, if the central axis of the through hole 255 and the central axis of the wiring trough 257 are not in a straight line, a distance between an extension line of the central axis of the through hole 255 and an extension line of the central axis of the wiring trough 257 may be less than a specified threshold. The specified threshold is a maximum range in which the cable 270 is not easy to break.

In this embodiment, the lower housing assembly 250 is provided with the upper housing supporting plane 251, the coil supporting plane 252, the magnet supporting plane 253, the circuit board supporting plane 256, and the like. The upper housing supporting plane 251 supports the upper housing assembly 210. The coil supporting plane 252 supports the magnetic sheet coil 220. The magnet supporting plane 253 supports the limiting magnet 230 and the heat dissipation ring 240. The circuit board supporting plane 256 supports the circuit board 260. A plurality of supporting planes of the wireless charger 200 may support the components at different positions, to avoid overlapping of the components. If the wireless charger 200 is affected by an external force, all the components that are overlapped together may be damaged. As a result, reliability of the wireless charger 200 is reduced.

In addition, top-view shapes of the magnetic sheet coil 220 and the heat dissipation ring 240 are circular ring shapes, and a top-view shape of the limiting magnet 230 is a round shape. With the limitation of the coil supporting plane 252 and the magnet supporting plane 253, the magnetic sheet coil 220, the limiting magnet 230, and the heat dissipation ring 240 may be sleeved together. This improves integration of the components and facilitates miniaturization of the wireless charger 200. Correspondingly, the inner side wall of the concave structure of the lower housing assembly 250 and the heat dissipation ring 240 constitute a transverse limiting structure of the magnetic sheet coil 220, so that structural stability of the wireless charger 200 can be improved.

FIG. 7 is a schematic diagram of a structure of an upper housing assembly of a wireless charger according to an embodiment. The upper housing assembly 210 is a part of the housing of the wireless charger 200. In a wireless charging process, the upper surface of the upper housing assembly 210 is in contact with a lower surface of the electronic device 100. In this embodiment, a top-view shape of the upper housing assembly 210 is related to the shape of the wireless charger 200. In an embodiment, the shape of the wireless charger 200 is a cylinder, and the top-view shape of the upper housing assembly 210 is a round shape.

As shown in FIG. 7, a periphery of the upper surface of the upper housing assembly 210 is flat, and the concave structure 211 is provided in a middle of the upper surface of the upper housing assembly 210. The concave structure 211 of the upper housing assembly 210 is used to support the electronic device 100 and limit a position of the electronic device 100. A bottom of the concave structure 211 of the upper housing assembly 210 is flat.

The electronic device 100 is disposed on the wireless charger 200, and a protrusion structure on the lower surface of the electronic device 100 is embedded into the concave structure on the upper surface of the upper housing assembly 210. The lower surface of the electronic device 100 is in contact with the upper surface of the upper housing assembly 210, so that a distance between a wireless charging coil of the electronic device 100 and a coil assembly 222 of the wireless charger 200 can be reduced, thereby reducing an electrical energy loss of the wireless charger. In another embodiment, the upper surface of the upper housing assembly 210 may be flat.

As shown in FIG. 7, the concave structure 211 of the upper housing assembly 210 is truncated cone shaped. In an embodiment, the concave structure of the upper housing assembly 210 is in a shape of a truncated cone-shaped column. A radius of a bottom of the concave structure 211 of the upper housing assembly 210 is less than a radius of an opening of the concave structure 211 of the upper housing assembly 210. In another embodiment, the concave structure 211 of the upper housing assembly 210 may alternatively be in another shape such as a cylinder or a cuboid. This is not limited.

The concave structure 211 is provided on the upper surface of the upper housing assembly 210 of the wireless charger 200 provided in this embodiment. The concave structure 211 on the upper surface of the upper housing assembly 210 may be coupled to a protrusion structure of the electronic device 100, so that a distance between the electronic device 100 and the wireless charger 200 can be shortened, and an electrical energy loss of wireless charging can be reduced. In addition, the concave structure 211 is provided on the upper surface of the upper housing assembly 210, so that a surface area of the upper surface of the wireless charger 200 can be increased, and a contact area between the wireless charger 200 and the electronic device 100 can be increased, thereby improving heat dissipation efficiency of the wireless charger 200.

In addition, in a wireless charging process, the electronic device 100 is disposed on the upper surface of the upper housing assembly 210 of the wireless charger 200. The protrusion structure of the electronic device 100 is embedded into the concave structure 211 of the upper housing assembly 210, and the protrusion structure of the electronic device 100 may be in contact with the concave structure 211 of the upper housing assembly 210. The periphery of the upper surface of the upper housing assembly 210 is in contact with the lower surface of the electronic device 100. Heat of the electronic device 100 is transferred to the housing of the wireless charger 200, so that a heat dissipation area of the electronic device 100 is increased, and reduction of a temperature of the electronic device 100 is accelerated.

As shown in FIG. 7, a truncated cone-shaped protrusion structure 212 may be further disposed on the lower surface of the upper housing assembly 210. The lower surface of the upper housing assembly 210 is a surface that is of the upper housing assembly 210 and that constitutes the cavity structure. In another embodiment, the protrusion structure 212 of the upper housing assembly 210 may alternatively be in another shape, such as a cylinder or a cuboid. This is not limited herein.

In an embodiment, the protrusion structure 212 is disposed at a middle position of the lower surface of the upper housing assembly 210. The upper housing assembly 210 and the lower housing assembly 250 constitute the cavity structure, and a top of the protrusion structure 22212 of the upper housing assembly 210 is coupled to at least one of the limiting magnet 230 or the heat dissipation ring 240.

In an embodiment, the upper housing assembly is made of a high thermally conductive material. The top of the protrusion structure 212 of the upper housing assembly 210 is coupled to at least one of the limiting magnet 230 and the heat dissipation ring 240, and the upper housing assembly 210 conducts heat of the electronic device 100 to the lower housing assembly 250 by using the heat dissipation ring 240 and the limiting magnet 230.

In an embodiment, the protrusion structure 212 of the upper housing assembly 210 is in a shape of a truncated cone-shaped column. A radius of a bottom of the protrusion structure 212 of the upper housing assembly 210 is greater than a radius of the top of the protrusion structure 212 of the upper housing assembly 210.

In an embodiment, a top-view shape of the top of the protrusion structure 212 of the upper housing assembly 210 is a round shape. A top-view shape of the heat dissipation ring 240 is a circular ring shape. A radius of the top of the protrusion structure 212 of the upper housing assembly 210 is greater than or equal to the outer radius of the heat dissipation ring 240.

In an embodiment, a top-view shape of the bottom of the protrusion structure 212 of the upper housing assembly 210 is a round shape. A top-view shape of the magnetic sheet coil 220 is a circular ring shape. A radius of the bottom of the protrusion structure 212 of the upper housing assembly 210 is less than the inner radius of the magnetic sheet coil 220.

In an embodiment, the thickness of the upper housing assembly 210 is less than a difference between the depth of the concave structure of the lower housing assembly 250 and the height of the limiting magnet 230. Alternatively, a thickness of the upper housing assembly 210 is less than a difference between the depth of the concave structure of the lower housing assembly 250 and the height of the heat dissipation ring 240.

As shown in FIG. 7, a circular notch 213 is further disposed on the lower surface of the upper housing assembly 210. The circular notch 213 is located around the protrusion structure 212 of the upper housing assembly 210 and is used to sleeve on the magnetic sheet coil 220. A lower surface of the circular notch of the upper housing assembly 210 is coupled to an upper surface of the magnetic sheet coil 220. The upper surface of the magnetic sheet coil 220 is a surface that is of the magnetic sheet coil 220 and that is close to the upper housing assembly 210.

In an embodiment, a top-view shape of the circular notch 213 of the upper housing assembly 210 is a circular ring shape. A top-view shape of the magnetic sheet coil 220 is a circular ring shape. An outer radius of the circular notch 213 of the upper housing assembly 210 is greater than the outer radius of the magnetic sheet coil 220. An inner radius of the circular notch 213 of the upper housing assembly 210 is less than the inner radius of the magnetic sheet coil 220.

In an embodiment, an inner side of the circular notch 213 of the upper housing assembly 210 is higher than an outer side of the circular notch 213 of the upper housing assembly 210.

The magnetic sheet coil 220 is configured to convert electrical energy into a wireless charging signal. The magnetic sheet coil 220 is mounted on the coil supporting plane 252 of the lower housing assembly 250. In a wireless charging process, after converting electrical energy into a wireless charging signal, the magnetic sheet coil 220 enables the wireless charging signal to radiate in a specified direction.

Figure 8:
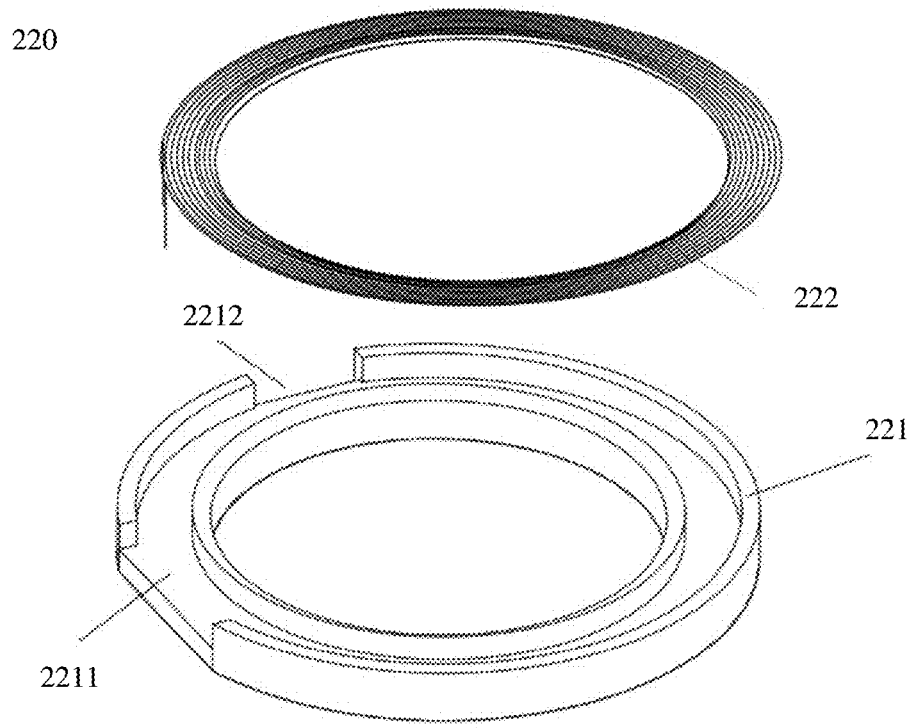
FIG. 8 is a schematic diagram of a structure of a magnetic sheet coil of a wireless charger according to an embodiment.

FIG. 8 is a schematic diagram of a structure of a magnetic sheet coil of a wireless charger according to an embodiment. As shown in FIG. 8, the magnetic sheet coil 220 includes a magnetic sheet assembly 221 and a coil assembly 222. In this embodiment, the magnetic sheet assembly 221 is in a shape of a toroidal column. A circular groove is provided on an upper surface of the magnetic sheet assembly 221 and is used to accommodate the coil assembly 222. An opening direction of the circular groove points to the upper housing assembly 210.

As shown in FIG. 8, a top-view shape of the circular groove of the magnetic sheet assembly 221 is a circular ring shape. The coil assembly 222 is disposed in the circular groove of the magnetic sheet assembly 221. A top-view shape of the coil assembly 222 is a circular ring shape. In this embodiment, top-view shapes of the magnetic sheet assembly 221, the circular groove, and the coil assembly 222 are circular ring shapes with a shared center.

In a process of assembling the magnetic sheet coil 220, the coil assembly 222 is bent into a shape of the circular groove of the magnetic sheet assembly 221. Then, an assembler disposes the coil assembly 222 in the circular groove of the magnetic sheet assembly 221. Finally, the assembler adds a bonding agent or a thermally conductive adhesive to the circular groove of the magnetic sheet assembly 221, to fasten the coil assembly 222 into the circular groove of the magnetic sheet assembly 221. In this embodiment, the coil assembly 222 is fastened in the circular groove of the magnetic sheet assembly 221, so as to avoid a change in a shape and a position of the coil assembly 222, which causes a change in a position and charging power of the wireless charger 200 and reduces stability of the wireless charger 200.

In this embodiment, the magnetic sheet assembly 221 is made of a magnetic material with a low conductivity. The coil assembly 222 is disposed in the circular groove of the magnetic sheet assembly 221. The magnetic sheet assembly 221 may shield a wireless charging signal radiated by the coil assembly 222 to a central area, so as to avoid an eddy current generated by the limiting magnet 240 disposed in a middle of an annular structure of the magnetic sheet coil 220. This not only can improve an electrical energy conversion rate of the wireless charger 200, but also can decelerate a temperature rise inside the wireless charger 200.

In an embodiment, an inner radius of the magnetic sheet assembly 221 is greater than or equal to the outer radius of the heat dissipation ring 240, so that the heat dissipation ring 240 may be mounted on the magnet supporting plane 253 by passing through the magnetic sheet assembly 221.

In an embodiment, the inner radius of the magnetic sheet assembly 221 is greater than or equal to a radius of the protrusion structure 213 of the upper housing assembly 210, so that the protrusion structure 213 of the upper housing assembly 210 may be in contact with the limiting magnet 230 and the heat dissipation ring 240.

In an embodiment, an outer radius of the magnetic sheet assembly 221 is less than or equal to the outer radius of the coil supporting plane 252 of the lower housing assembly 250, so that the magnetic sheet assembly 221 may be disposed on the coil supporting plane 252 of the lower housing assembly 250.

In an embodiment, a thickness of the magnetic sheet assembly 221 is less than or equal to a distance between the upper housing supporting plane 251 and the coil supporting plane 252 of the lower housing assembly 250, so that the magnetic sheet assembly 221 is disposed on the coil supporting plane 252 of the lower housing assembly 250, to avoid affecting fastening of the upper housing assembly 210 to the upper housing supporting plane 251 of the lower housing assembly 250.

In this embodiment, a top-view cross-sectional area of an opening of the circular groove of the magnetic sheet assembly 221 is less than a top-view cross-sectional area of a bottom of the circular groove of the magnetic sheet assembly 221. Alternatively, a top-view cross-sectional area of an opening of the circular groove of the magnetic sheet assembly 221 is less than a top-view cross-sectional area of any position between the opening of the circular groove of the magnetic sheet assembly 221 and a bottom of the circular groove of the magnetic sheet assembly 221.

Figure 9:
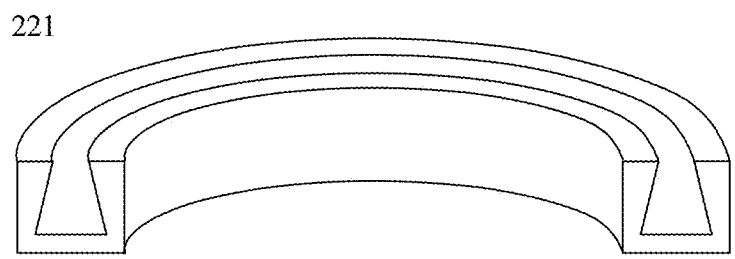
FIG. 9 is a schematic diagram of a cross-sectional structure of a magnetic sheet coil of a wireless charger according to an embodiment.

As shown in FIG. 9, an outer side wall surface and an inner side wall surface of the circular groove of the magnetic sheet assembly 221 are oblique surfaces, so that the circular groove of the magnetic sheet assembly 221 is in a shape of a toroidal truncated cone-shaped column with the opening smaller than the bottom. The coil assembly 222 is disposed in the circular groove of the magnetic sheet assembly 221, and a magnetic conductive material wraps the coil assembly 222 as much as possible. The magnetic sheet coil 220 is mounted in the wireless charger 200, and the opening of the circular groove of the magnetic sheet assembly 221 faces the upper housing assembly 210. When the wireless charger 200 performs wireless charging, a wireless charging signal generated by the coil assembly 222 radiates only to a direction of the electronic device 100, so that an electrical energy conversion rate of the wireless charger 200 is improved.

In another embodiment, the circular groove of the magnetic sheet assembly 221 may be in a shape of a toroidal column or in another shape. When the shape of the circular groove of the magnetic sheet assembly 221 is a toroidal column, the outer side wall surface of the circular groove of the magnetic sheet assembly 221 is parallel to an outer side wall surface of the magnetic sheet assembly 221, and the inner side wall surface of the circular groove of the magnetic sheet assembly 221 is parallel to an inner side wall surface of the magnetic sheet assembly 221.

For example, the electronic device 100 is an electronic watch. Components such as a heart rate detection module and a temperature detection module may be mounted in a middle area of a charging coil of the electronic device 100. When wireless charging is performed on the electronic device 100, the components such as the heart rate detection module and the temperature detection module are located in a middle area of the coil assembly 222 of the wireless charger 200. The circular groove of the magnetic sheet coil 220 in the wireless charger 200 provided in this embodiment may wrap the coil assembly 22, to limit a direction in which the coil assembly 222 radiates a wireless charging signal, so that a vortex generated by the coil assembly 222 does not affect the components such as the heart rate detection module and the temperature detection module of the electronic device 100.

As shown in FIG. 8, a top-view shape of the magnetic sheet assembly 221 and the circular groove of the magnetic sheet assembly 221 is a circular ring shape. In an embodiment, a ratio of an outer radius to an inner radius of the circular groove of the magnetic sheet assembly 221 is greater than 1.9. In an embodiment, the ratio of the outer radius to the inner radius of the circular groove of the magnetic sheet assembly 221 is greater than 1.7. A smaller ratio between the inner radius and the outer radius of the circular groove of the magnetic sheet assembly 221 in the wireless charger 200 provided in this embodiment indicates a larger width of the top-view shape of the circular groove of the magnetic sheet assembly 221, and a larger area of the top-view shape of the coil assembly 222 that is accommodated by the circular groove of the magnetic sheet assembly 221, so that a wireless charging area of the wireless charger 200 can be increased. After the width of the circular groove of the magnetic sheet assembly 221 is increased, a larger quantity of turns of the coil assembly 222 are accommodated by the circular groove of the magnetic sheet assembly 221, so that wireless charging power of the wireless charger 200 can be increased. A larger depth of the circular groove of the magnetic sheet assembly 221 indicates a larger quantity of turns of the coil assembly 222 that can be accommodated by the circular groove of the magnetic sheet assembly 221, and higher charging power of the wireless charger 200.

In an embodiment, the lower surface of the upper housing assembly 210 is flat, and heights of the magnetic sheet assembly 221 on two sides of the circular groove of the magnetic sheet assembly 221 may be the same. A direction of a wireless charging signal radiated by the magnetic sheet coil 220 is an upward direction perpendicular to the upper surface of the magnetic sheet coil 220.

In an embodiment, there is a protrusion structure 212 on the lower surface of the upper housing assembly 210, and heights of the magnetic sheet assembly 221 on two sides of the circular groove of the magnetic sheet assembly 221 may be different. A height of the magnetic sheet assembly 221 on an inner side of the circular groove of the magnetic sheet assembly 221 is less than a height of the magnetic sheet assembly 221 on an outer side of the circular groove of the magnetic sheet assembly 221. In another embodiment, the circular notch 213 is provided on the lower surface of the upper housing assembly 210. The circular notch 213 on the lower surface of the upper housing assembly 210 is located around the protrusion structure 212. In an assembly process, when the upper housing assembly 210 is mounted on the upper housing supporting plane 251, the magnetic sheet assembly 221 is embedded in the circular notch 213 on the lower surface of the upper housing assembly 210. In this embodiment, the circular notch 213 is provided on the lower surface of the upper housing assembly 210, so that a depth of the circular groove of the magnetic sheet assembly 221 can be increased, thereby improving charging power of the wireless charger 200.

As shown in FIG. 8, the magnetic sheet assembly 221 is provided with a plurality of breaches. For example, the magnetic sheet assembly 221 is provided with a breach 2211 and a breach 2212. The breach 2211 is used to limit an orientation of the magnetic sheet coil 220 mounted on the coil supporting plane 252. In this embodiment, the magnetic sheet assembly 221 is in a shape of a toroidal column, and the breach 2211 is located on the outer side of the circular groove of the magnetic sheet assembly 221. Correspondingly, a protrusion is provided on an outer edge of the coil supporting plane 252. A shape of the protrusion of the coil supporting plane 252 matches a shape of the breach 2211 of the magnetic sheet assembly 221. The magnetic sheet coil 220 is mounted on the coil supporting plane 252, and the breach 2211 of the magnetic sheet assembly 221 is coupled to the protrusion of the coil supporting plane 252. The breach 2211 of the magnetic sheet assembly 221 may limit an orientation in which the magnetic sheet coil 220 is mounted on the coil supporting plane 252, so as to prevent the magnetic sheet coil 220 from rotating in the wireless charger 2000. In another embodiment, a positioning part 2211 provided on the magnetic sheet assembly 221 may also be of another structure, such as a protrusion structure or a buckle.

The breach 2212 is located on the outer side of the circular groove of magnetic sheet assembly 221. The circuit board 260 may be located on a bottom of the magnetic sheet assembly 221, so as to prevent the coil assembly 222 from generating a vortex on the circuit board 260. Both ends of the coil assembly 222 pass through the wiring trough 2212 and are welded to an endpoint of the circuit board 260 by using solder. In another embodiment, the breach 2212 is located on the inner side of the circular groove of the magnetic sheet assembly 221. The breach 2211 and the breach 2212 may be a same breach.

In this embodiment, the magnetic sheet assembly 221 of the magnetic sheet coil 220 may replace the limiting magnet 230. In an embodiment, the N pole of the limiting magnet of the electronic device 100 faces upward, and the S pole faces downward. After the magnetic sheet assembly 221 is magnetized, the N pole of the magnetic sheet assembly 221 faces upward, and the S pole faces downward. In an embodiment, the S pole of the limiting magnet of the electronic device 100 faces upward, and the N pole faces downward. After the magnetic sheet assembly 221 is magnetized, the S pole of the magnetic sheet assembly 221 faces upward, and the N pole faces downward. The electronic device 100 is disposed on the upper housing assembly 210 of the wireless charger 200, and the electronic device 100 fits a specified position of the upper housing assembly 210 of the wireless charger 200 through limitation of the limiting magnets of the electronic device 100 and the wireless charger 200.

Figure 10:
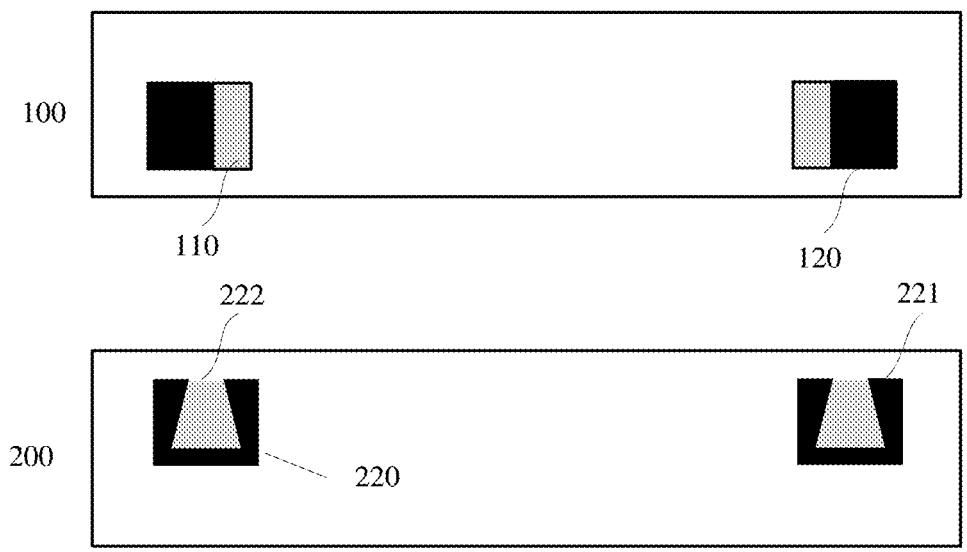
FIG. 10 is a schematic diagram of a structure of an electronic device and a wireless charger thereof according to an embodiment.

FIG. 10 is a schematic diagram of a structure of an electronic device 100 and a wireless charger 200 thereof according to an embodiment. The electronic device 100 may be a watch, a mobile phone, a headset, a tablet, a computer, or the like. The charger 200 may be a portable wireless charger, an in-vehicle wireless charger, or the like. For ease of describing a charging coil and a limiting magnet of an electronic device 100 or a charger 200, other circuits or structures of the electronic device 100 and the wireless charger 200 are omitted in FIG. 10.

As shown in FIG. 10, the electronic device 100 includes a wireless charging coil 110 and a limiting magnet 120. The wireless charger 200 includes a magnetic sheet coil 220. The magnetic sheet coil 220 includes a magnetic sheet assembly 221 and a coil assembly 222. The coil assembly 222 is disposed in a circular groove of the magnetic sheet assembly 221. An opening of the circular groove of the magnetic sheet assembly 221 faces upward.

As shown in FIG. 10, the wireless charger 200 is horizontally disposed on a desktop, and the electronic device 100 is stacked on the wireless charger 200. The limiting magnet 120 of the electronic device 100 matches the magnetic sheet assembly 221 of the wireless charger 200 and limits the electronic device 100 to a specified position on an upper surface of the wireless charger 200. Wireless charging may be performed after the charging coil 110 of the electronic device 100 matches the coil assembly 222 of the wireless charger 200.

Figure 11:
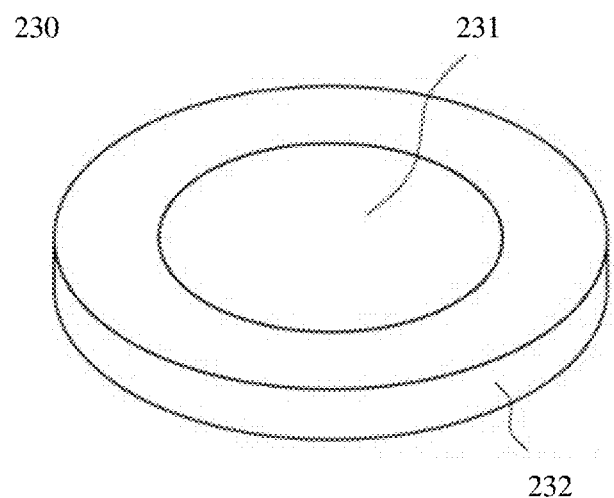
FIG. 11 is a schematic diagram of a structure of a limiting magnet of a wireless charger according to an embodiment.

FIG. 11 is a schematic diagram of a structure of a limiting magnet of a wireless charger according to an embodiment. A limiting magnet 230 of the wireless charger provided in this embodiment may include one independent magnet, for example, a cylindrical magnet or a magnet of a toroidal column. The limiting magnet 230 may include a plurality of magnets. For example, the limiting magnet 230 may be a cylindrical magnet formed by splicing a cylindrical magnet and a plurality of magnets of toroidal columns.

As shown in FIG. 11, a limiting magnet 230 includes a first magnet 231 and a second magnet 232. The first magnet 231 and the second magnet 232 are adjacently disposed on a same surface. The first magnet 231 is of a cylindrical structure, and a top-view cross-sectional shape of the first magnet 231 is a round shape. The second magnet 232 is of an annular cylindrical structure, and a top-view cross-sectional shape of the second magnet 232 is a circular ring shape. An inner radial size of the second magnet 232 is greater than or equal to a radial size of the first magnet 231. The first magnet 231 is disposed on an inner side of the second magnet 232.

In this embodiment, if the N pole of the first magnet 231 faces upward, the S pole faces downward, the N pole of the second magnet 232 faces an inner side of the circular ring, and the S pole faces an outer side of the circular ring, magnetic fields of the first magnet 231 and the second magnet 232 enhance each other on an upper side of the limiting magnet 230, and magnetic adsorption between an upper side of a wireless charger 200 and a lower side of an electronic device 100 is enhanced, so that a contact position between the electronic device 100 and the wireless charger 200 can be better limited, and a charging coil of the electronic device 100 easily matches a charging coil of the wireless charger 200, thereby improving convenience of wireless charging. The magnetic fields of the first magnet 231 and the second magnet 232 weaken each other on a lower side of the limiting magnet 230, and magnetic field strength on the lower side of the limiting magnet 230 weakens. This not only can reduce impact of the limiting magnet 230 in the wireless charger 200 on another magnetic sensitive device, but also can omit or reduce a soft magnetic material, so that heat dissipation and miniaturization of the wireless charger 200 are facilitated.

Figure 12:
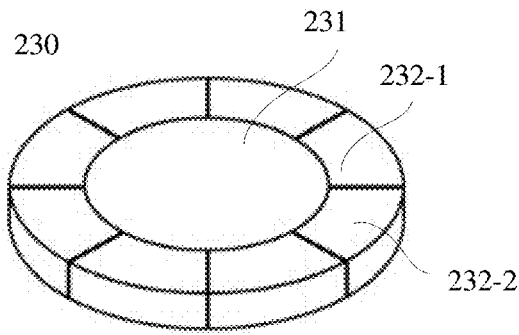
FIG. 12 is a schematic diagram of a structure of another limiting magnet of a wireless charger according to an embodiment.

As shown in FIG. 12, the second magnet 232 includes a plurality of permanent magnet modules and the plurality of permanent magnet modules may be spliced to form an annular cylindrical structure. In this embodiment, a top-view cross-sectional shape of the plurality of permanent magnet modules in the second magnet 232 is an arc. The permanent magnet module may be a sector magnet with an angle of 360/M degrees. M is a quantity of permanent magnet modules that are spliced to form one circular ring-shaped permanent magnet and is greater than or equal to 2. In some embodiments, a top-view cross-sectional shape of the permanent magnet module may alternatively be a polygon such as a triangle or a quadrilateral. According to internal space of the charger 200, permanent magnet modules of various shapes may be selected for the limiting magnet 230, to improve applicability of the limiting magnet 230.

In some embodiments, the first magnet 231 of the limiting magnet 230 may include a plurality of permanent magnet modules and the plurality of permanent magnet modules may be spliced to form a cylindrical structure. In some embodiments, the second magnet 232 of the limiting magnet 230 may include only one permanent magnet module in a shape of an annular cylinder. In some embodiments, the first magnet 231 and the second magnet 232 of the limiting magnet 230 each include a plurality of permanent magnet modules. In other words, the plurality of permanent magnets in the limiting magnet 230 may each include one or more permanent magnet modules.

In an embodiment, a magnetic field direction inside the first magnet 231 is perpendicular to a surface, and a magnetic field direction inside the second magnet 232 is parallel to the surface. The magnetic field direction inside the first magnet 231 is perpendicular to the magnetic field direction inside the second magnet 232.

In an embodiment, a magnetic field direction inside the first magnet 231 is parallel to a surface, and a magnetic field direction inside the second magnet 232 is perpendicular to the surface. The magnetic field direction inside the first magnet 231 is perpendicular to the magnetic field direction inside the second magnet 232.

In an embodiment, a top-view cross-sectional shape of the first magnet 231 is one of a round shape or a polygon, and a top-view cross-sectional shape of the second magnet 232 is an annular shape. The annular shape may be a circular ring shape or a polygonal ring shape.

In an embodiment, the first magnet 231 and the second magnet 232 are fixedly connected to each other.

In an embodiment, the first magnet 231 and the second magnet 232 are separately fastened on a surface of the concave structure of the lower housing assembly 250.

Figure 13:
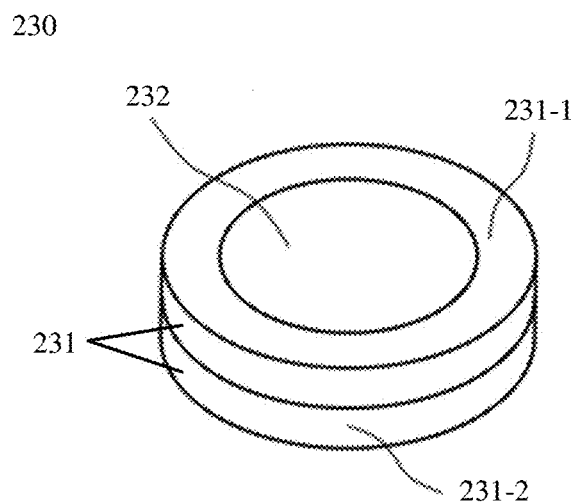
FIG. 13 is a schematic diagram of a structure of another limiting magnet of a wireless charger according to an embodiment.

FIG. 13 is a schematic diagram of a structure of a limiting magnet according to an embodiment. As shown in FIG. 13, a limiting magnet 230 includes a first assembly 231 and a second assembly 232. The first assembly 231 and the second assembly 232 are disposed on a same surface along a first direction. The first assembly 231 and the second assembly 232 may be disposed on a same surface in a horizontal direction. A top-view cross-sectional shape of the first assembly 231 is in a circular ring shape, and the second assembly 232 is of a cylindrical structure. An inner radial size of the first assembly 231 is greater than or equal to a radial size of the second assembly 232. The second assembly 232 is disposed on an inner side of the first assembly 231. In an embodiment, the first assembly 231 and the second assembly 232 may be fixedly connected, to form an overall structure. In another embodiment, the first assembly 231 and the second assembly 232 may be separately fastened on a same surface, and there may be a gap or a filling material between the first assembly 231 and the second assembly 232.

The first assembly 231 includes a first magnet 231-1 and a second magnet 231-2. The second assembly 232 includes a second assembly 232. The first magnet 231-1 and the second magnet 231-2 are disposed in a stacked manner along a second direction. The first magnet 231-1 and the second magnet 231-2 may be disposed vertically on the surface in a stacked manner. Top-view cross-sectional shapes of both the first magnet 231-1 and the second magnet 231-2 are circular ring shapes. In an embodiment, the first magnet 231-1 and the second magnet 231-2 may be fixedly connected to form an overall structure. In another embodiment, the first magnet 231-1 and the second magnet 231-2 may be separately fastened on a side face of the second assembly 232, and there may be a gap or a filling material between the first magnet 231-1 and the second magnet 231-2.

In this embodiment, the S pole of the first magnet 231-1 faces an inner side of the circular ring, and the N pole faces an outer side of the circular ring. The N pole of the second magnet 231-2 faces the inner side of the circular ring, and the S pole faces the outer side of the circular ring. The S pole of the second assembly 232 faces upward, and the N pole faces downward. The S pole of the first magnet 231-1 and the S pole of the second assembly 232 enhance each other on an upper side of a magnetic suction apparatus 500, so that magnetic field strength on the upper side of the magnetic suction apparatus 500 is enhanced.

In an embodiment, there may be two or more magnets in the first assembly 231. There may be two or more magnets in the second assembly 232.

In an embodiment, a magnetic field direction inside the magnets of the first assembly 231 is perpendicular to a surface, and a magnetic field direction inside the magnets of the second assembly 232 is parallel to the surface. The magnetic field direction inside the magnets of the first assembly 231 is perpendicular to the magnetic field direction inside the magnets of the second assembly 232.

In an embodiment, a magnetic field direction inside the magnets of the first assembly 231 is parallel to a surface, and a magnetic field direction inside the magnets of the second assembly 232 is perpendicular to the surface. The magnetic field direction inside the magnets of the first assembly 231 is perpendicular to the magnetic field direction inside the magnets of the second assembly 232.

In an embodiment, a top-view cross-sectional shape of the magnets of the first assembly 231 is one of a round shape or a polygon, and a top-view cross-sectional shape of the magnets of the second assembly 232 is an annular shape. The annular shape may be a circular ring shape or a polygonal ring shape.

In an embodiment, the magnets in the first assembly 231 and the magnets in the second assembly 232 are fixedly connected.

In an embodiment, the magnets in the first assembly 231 and the magnets in the second assembly 232 are separately fastened on a surface of the concave structure of the lower housing assembly 250.

In an embodiment, the magnet in the first assembly 231 is formed by splicing one or more sub-magnet modules. The magnet in the second assembly 232 is formed by splicing one or more sub-magnet modules.

A position relationship among the magnetic sheet coil 220, the limiting magnet 230, and the heat dissipation ring 240 in the wireless charger 200 provided in this embodiment is not limited to the position relationship shown in FIG. 3, and there may be another position relationship. For example, FIG. 14 to FIG. 16 are schematic diagrams of a position relationship among a magnetic sheet coil, a limiting magnet, and a heat dissipation ring of a wireless charger according to embodiments.

Figure 14:
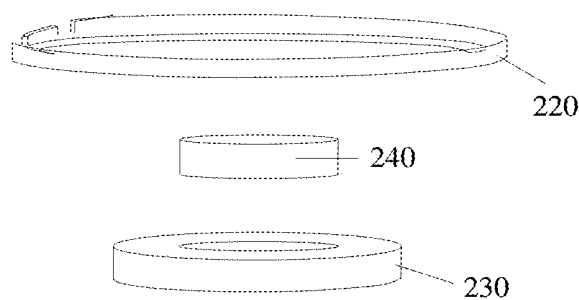
FIG. 14 is a schematic diagram of a position relationship among a magnetic sheet coil, a limiting magnet, and a heat dissipation ring of a wireless charger according to an embodiment.

As shown in FIG. 14, a wireless charger 200 includes a magnetic sheet coil 220, a limiting magnet 230, and a heat dissipation ring 240. A top-view shape of the magnetic sheet coil 220 is a circular ring shape. A top-view shape of the limiting magnet 230 is a circular ring shape. A top-view shape of the heat dissipation ring 240 is a round shape or a circular ring shape. In this case, an outer radius of the magnetic sheet coil 220 is less than or equal to an inner radius of a coil supporting plane 252 of a lower housing assembly 250. An outer radius of the limiting magnet 230 is less than or equal to an inner radius of the magnetic sheet coil 220. An inner radius of the limiting magnet 230 is greater than or equal to an outer radius of the magnetic sheet coil 220. A height of the limiting magnet 230 is the same as a height of the heat dissipation ring 240, or a height of the limiting magnet 230 is different from a height of the heat dissipation ring 240.

The magnetic sheet coil 220 is disposed on the coil supporting plane 252 of the lower housing assembly 250. The heat dissipation ring 240 is embedded in an annular structure of the magnetic sheet coil 220 and is fastened to a magnet supporting plane 253 of the lower housing assembly 250. The limiting magnet 230 is embedded in the heat dissipation ring 240 and is fastened to the magnet supporting plane 253 of the lower housing assembly 250. Correspondingly, the heat dissipation ring 240 is embedded between the limiting magnet 230 and the magnetic sheet coil 220. In an embodiment, a gap among the heat dissipation ring 240, the limiting magnet 230, and the magnetic sheet coil 220 may be filled with a thermally conductive adhesive, so as to improve heat dissipation efficiency of the wireless charger 200.

Figure 15:
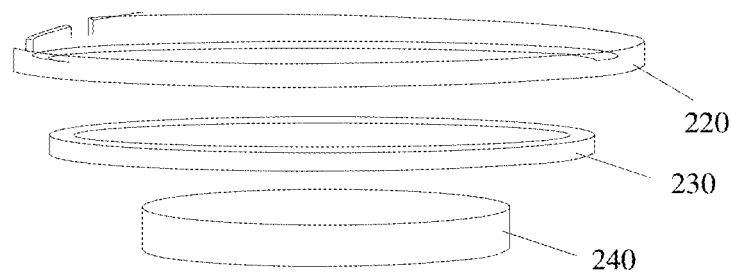
FIG. 15 is a schematic diagram of a position relationship among a magnetic sheet coil, a limiting magnet, and a heat dissipation ring of another wireless charger according to an embodiment.
Figure 16:
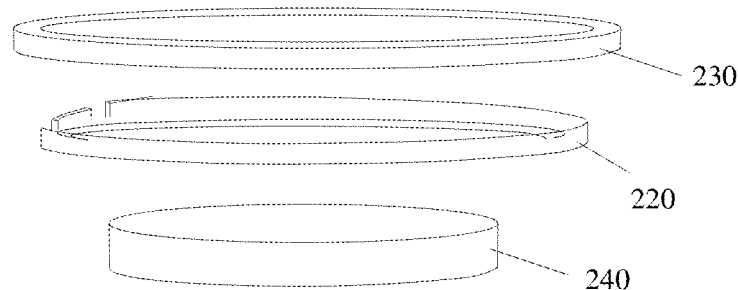
FIG. 16 is a schematic diagram of a position relationship among a magnetic sheet coil, a limiting magnet, and a heat dissipation ring of another wireless charger according to an embodiment.

As shown in FIG. 15, a wireless charger 200 includes a magnetic sheet coil 220, a limiting magnet 230, and a heat dissipation ring 240. A top-view shape of the magnetic sheet coil 220 is a circular ring shape. A top-view shape of the limiting magnet 230 is a circular ring shape. A top-view shape of the heat dissipation ring 240 is a round shape or a circular ring shape. In this case, an outer radius of the magnetic sheet coil 220 is less than or equal to an inner radius of a coil supporting plane 252 of a lower housing assembly 250. An outer radius of the limiting magnet 230 is less than or equal to an inner radius of the magnetic sheet coil 220. An inner radius of the limiting magnet 230 is greater than or equal to an outer radius of the heat dissipation ring 240. A height of the magnetic sheet coil 220 is the same as a height of the limiting magnet 230.

In a process of assembling the wireless charger 200, the magnetic sheet coil 220 is disposed on the coil supporting plane 252 of the lower housing assembly 250. The limiting magnet 230 is embedded in the magnetic sheet coil 220 and is fastened to the coil supporting plane 252 of the lower housing assembly 250. The heat dissipation ring 240 is embedded in the limiting magnet 230 and is fastened to a magnet supporting plane 253 of the lower housing assembly 250.

As shown in FIG. 16, a wireless charger 200 includes a magnetic sheet coil 220, a limiting magnet 230, and a heat dissipation ring 240. A top-view shape of the magnetic sheet coil 220 is a circular ring shape. A top-view shape of the limiting magnet 230 is a circular ring shape. A top-view shape of the heat dissipation ring 240 is a round shape or a circular ring shape. In this case, an outer radius of the limiting magnet 230 is less than or equal to an inner radius of a coil supporting plane 252 of a lower housing assembly 250. An outer radius of the magnetic sheet coil 220 is less than or equal to an inner radius of the limiting magnet 230. An inner radius of the magnetic sheet coil 220 is greater than or equal to an outer radius of the heat dissipation ring 240. A height of the magnetic sheet coil 220 is the same as a height of the limiting magnet 230.

In a process of assembling the wireless charger 200, the limiting magnet 230 is fastened to the coil supporting plane 252 of the lower housing assembly 250. The magnetic sheet coil 220 is embedded in the limiting magnet 230 and is fastened to the coil supporting plane 252 of the lower housing assembly 250. The heat dissipation ring 240 is embedded in the magnetic sheet coil 220 and is fastened to a magnet supporting plane 253 of the lower housing assembly 250.

The circuit board 260 of the wireless charger 200 provided in this embodiment may include a circuit such as an alternating current/direct current converter and a protective circuit. The alternating current/direct current converter converts an alternating current into a direct current or converts a direct current into an alternating current. The protective circuit enables the wireless charger 200 to be in an open circuit state when a short circuit occurs in the wireless charger 200. In this embodiment, an input end of the circuit board 260 is electrically connected to the cable 270, and an output end of the circuit board 260 is electrically connected to the coil assembly 222 of the magnetic sheet coil 220. In this embodiment, the circuit board 260 may also be referred to as a printed circuit board assembly (PCBA).

As shown in FIG. 4, the circuit board 260 is disposed in the receiving cavity of the lower housing assembly 250. In this embodiment, a distance between a plane on which the circuit board supporting plane 256 is located and a plane on which the coil supporting plane 253 is located is greater than the thickness of the circuit board 260.

In an embodiment, the magnetic sheet coil 220 is disposed on the coil supporting plane 252 of the lower housing assembly 250, the circuit board 260 is disposed on the circuit board supporting plane 256 of the lower housing assembly 250, and there is a gap between an upper surface of the circuit board 260 and a lower surface of the magnetic sheet coil 220. The upper surface of the magnetic sheet coil 220 deforms due to an external force, and the deformation of the magnetic sheet coil 220 does not squeeze the circuit board 260, so as to avoid damage to the circuit board 260.

In an embodiment, the magnetic sheet coil 220 is disposed on the coil supporting plane 252 of the lower housing assembly 250, and the circuit board 260 is fastened on the lower surface of the magnetic sheet coil 220 by using a bonding agent, so as to improve stability of the circuit board 260.

Figure 17:
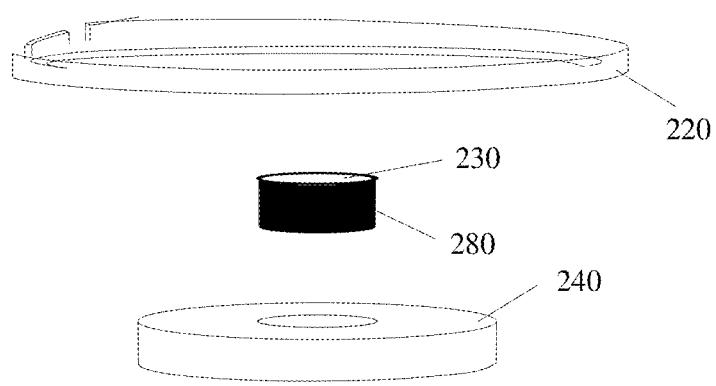
FIG. 17 is a schematic diagram of a limiting magnet and a shielding assembly of a wireless charger according to an embodiment.

FIG. 17 is a schematic diagram of a limiting magnet and a shielding assembly of a wireless charger according to an embodiment. In this embodiment, the wireless charger 200 further includes a shielding assembly 280. The shielding assembly 280 is made of a high electrical conductivity material, such as copper or aluminum. A thickness of the shielding assembly 280 is greater than a skin depth. The skin depth is a thickness of most charges when charges are transmitted in a conductor. If the thickness of the shielding assembly 280 is less than the skin depth, the shielding assembly 280 cannot effectively isolate a wireless charging signal.

A shape of the shielding assembly 280 is related to a shape of the limiting magnet 230. In an embodiment, the limiting magnet 230 is in a shape of a cylinder, and the shielding assembly 280 is in a shape of a hollow cylinder, a toroidal column, or the like. In an embodiment, the limiting magnet 230 is in a shape of a truncated cone-shaped column, and the shielding assembly 280 is in a shape of a hollow truncated cone-shaped column, a truncated cone-shaped annular column, or the like. The shielding assembly 280 may also be in another shape.

The shape of the shielding assembly 280 is related to a shielding manner. The limiting magnet 230 is used as an example, and the limiting magnet 230 is in a shape of a cylinder. The shielding assembly 280 shields an entire surface of the limiting magnet 230, and the shielding assembly 280 is in a shape of a hollow cylinder. The shielding assembly 280 shields a side face of the limiting magnet 230, and the shielding assembly 280 is in a shape of a toroidal column. The shielding assembly 280 may also be in another shape.

In this embodiment, the limiting magnet 230 is of a columnar structure, the heat dissipation ring 240 is of an annular structure, and the shielding assembly 280 disposed on an outer surface on a periphery of the limiting magnet 230 is in contact with an inner side surface of the heat dissipation ring 240. In an embodiment, the limiting magnet 230 is of a cylindrical structure, the heat dissipation ring 240 is of a circular ring-shaped structure, and the shielding assembly 280 disposed on a side face of the limiting magnet 230 is in contact with an inner side surface of the heat dissipation ring 240.

In an embodiment, the shielding assembly 280 is disposed in a middle of the heat dissipation ring 240, and the shielding assembly 280 is fastened to the heat dissipation ring 240 by using a bonding agent, so as to improve stability of the wireless charger 200. In an embodiment, the shielding assembly 280 is disposed in the middle of the heat dissipation ring 240, and a gap between the heat dissipation ring 240 and the shielding assembly 280 is filled with a thermally conductive adhesive, so as to improve heat transfer efficiency between components of the wireless charger 200.

As shown in FIG. 17, the shielding assembly 280 of the wireless charger 200 is disposed on the outer surface on the periphery of the limiting magnet 230. In this embodiment, the limiting magnet 230 is in a cylindrical shape, and the shielding assembly 280 is disposed on a side face of the limiting magnet 230. The shielding assembly 280 may prevent a wireless charging signal from being reflected to the limiting magnet 230 and prevent the wireless charging signal generated by the coil assembly 222 from forming a vortex on the limiting magnet 230, so as to avoid a temperature rise inside the wireless charger 200.

In an embodiment, the shielding assembly 280 is further disposed on at least a part of an upper surface of the limiting magnet 230. In an embodiment, the shielding assembly 280 is further disposed on at least a part of a lower surface of the limiting magnet 230. In an embodiment, the shielding assembly 280 is further disposed on at least a part of the upper surface and at least a part of the lower surface of the limiting magnet 230. The upper surface of the limiting magnet 230 is a surface that is of the limiting magnet 230 and that is close to the upper housing assembly 210. The lower surface of the limiting magnet 230 is a surface that is of the limiting magnet 230 and that is close to the bottom of the concave structure of the lower housing assembly 250.

In an embodiment, the shielding assembly 280 is further disposed on at least a part of an upper surface of the heat dissipation ring 240. In an embodiment, the shielding assembly 280 is further disposed on at least a part of a lower surface of the heat dissipation ring 240. In an embodiment, the shielding assembly 280 is further disposed on at least a part of the upper surface and at least a part of the lower surface of the heat dissipation ring 240. The upper surface of the heat dissipation ring 240 is a surface that is of the heat dissipation ring 240 and that is close to the upper housing assembly 210. The lower surface of the heat dissipation ring 240 is a surface of the heat dissipation ring 240 that is close to the bottom of the concave structure of the lower housing assembly 250.

In an embodiment, the shielding assembly 280 disposed on the upper surface of the limiting magnet 230 is in contact with the lower surface of the upper housing assembly 210. In an embodiment, the shielding assembly 280 disposed on the upper surface of the heat dissipation ring 240 is in contact with the lower surface of the upper housing assembly 210.

In an embodiment, the shielding assembly 280 disposed on the lower surface of the limiting magnet 230 is in contact with the bottom of the concave structure of the lower housing assembly 250. In an embodiment, the shielding assembly 280 disposed on the lower surface of the heat dissipation ring 240 is in contact with the bottom of the concave structure of the lower housing assembly 250.

In an embodiment, the shielding assembly 280 disposed on the upper surface of the limiting magnet 230 and the shielding assembly 280 disposed on the upper surface of the heat dissipation ring 240 are on a same plane. In an embodiment, the shielding assembly 280 disposed on the lower surface of the limiting magnet 230 and the shielding assembly 280 disposed on the lower surface of the heat dissipation ring 240 are on a same plane.

Figure 18:
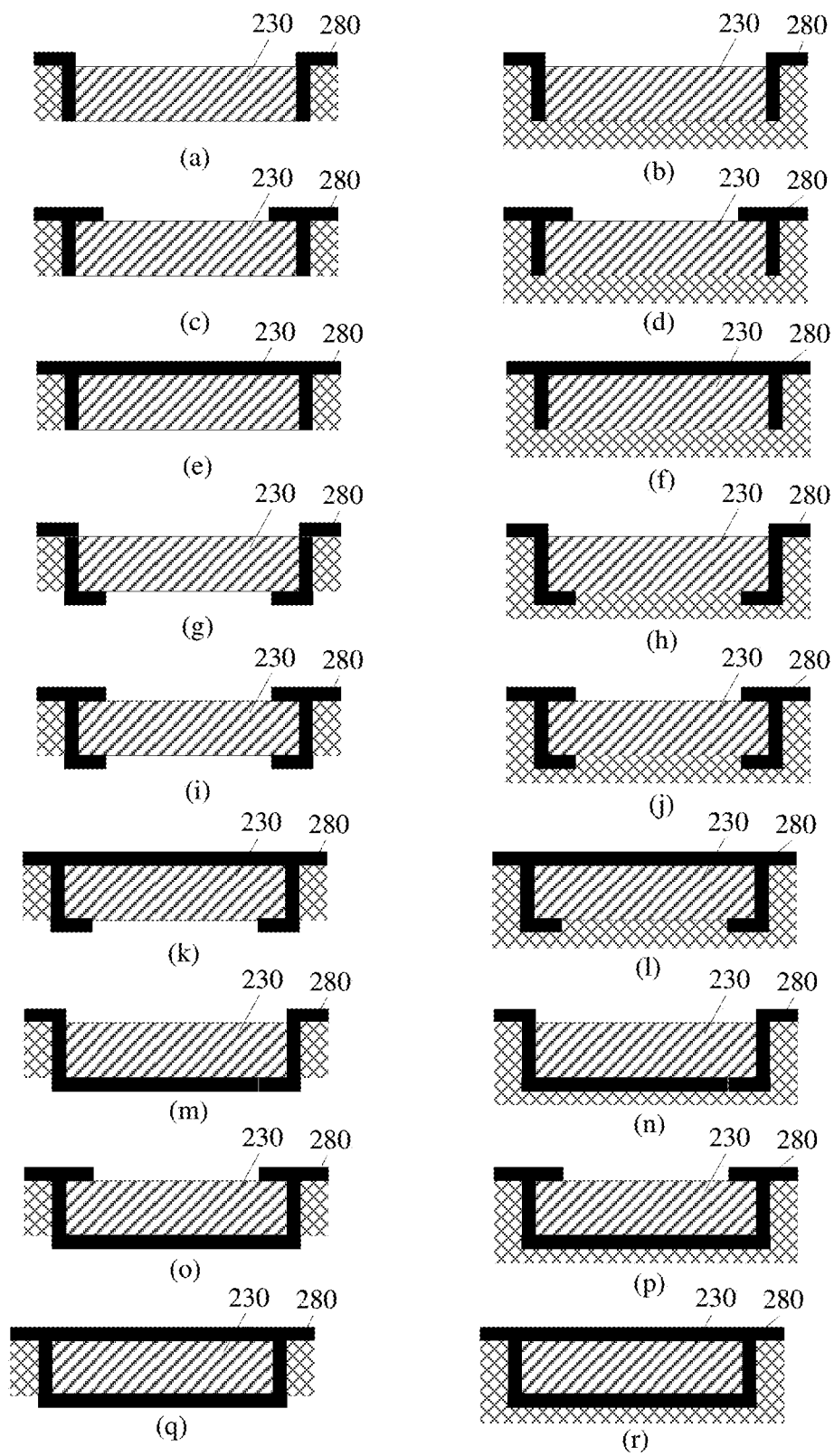
FIG. 18 is a schematic diagram of 18 combinations of a limiting magnet 230, a shielding assembly 280, and a thermally conductive adhesive according to an embodiment.

As shown in FIG. 18 (a), the shielding assembly 280 is mounted between the heat dissipation ring 240 and the limiting magnet 230. The shielding assembly 280 is in a shape of a toroidal column, and a top-view shape of an epitaxial edge is a circular ring shape. An opening at an upper end of the shielding assembly 280 is provided with the epitaxial edge, and an outer radius of the epitaxial edge is less than or equal to an inner radius of the magnetic sheet coil 220. The epitaxial edge of the shielding assembly 280 is disposed on the upper surface of the heat dissipation ring 240, so as to facilitate the assembler to mount the shielding assembly 280. The epitaxial edge of the shielding assembly 280 may be in contact with the magnetic sheet coil 220, so that a heat conduction loop is formed between the magnetic sheet coil 220 and the limiting magnet 230, thereby improving heat transfer efficiency between components of the wireless charger 200. A gap between the heat dissipation ring 240 and the shielding assembly 280 may be filled with a thermally conductive adhesive, so as to improve heat transfer efficiency between the components of the wireless charger 200.

A part in FIG. 18 (*b*) that is the same as that in FIG. 18 (*a*) is not described again. As shown in FIG. 18 (*b*), a gap between the limiting magnet 230 and the magnet supporting plane 253 of the lower housing assembly 250 may be further filled with a thermally conductive adhesive, so as to improve heat transfer efficiency among the limiting magnet 230, the heat dissipation ring 240, and the lower housing assembly 250 in the wireless charger 200.

A part in FIG. 18 (*c*) that is the same as that in FIG. 18 (*a*) is not described again. As shown in FIG. 18 (*c*), the shielding assembly 280 is further disposed on a part of the upper surface of the limiting magnet 230, so as to facilitate the assembler to mount the shielding assembly 280.

A part in FIG. 18 (*d*) that is the same as that in FIG. 18 (*c*) is not described again. As shown in FIG. 18 (*d*), a gap between the limiting magnet 230 and the magnet supporting plane 253 of the lower housing assembly 250 may be further filled with a thermally conductive adhesive, so as to improve heat transfer efficiency among the limiting magnet 230, the heat dissipation ring 240, and the lower housing assembly 250 in the wireless charger 200.

A part in FIG. 18 (*e*) that is the same as that in FIG. 18 (*c*) is not described again. As shown in FIG. 18 (*e*), the epitaxial edge of the shielding assembly 280 may be further disposed on the entire upper surface of the heat dissipation ring 240. Correspondingly, a side face of the shielding assembly 280 may be in a shape of a toroidal column, and a top-view shape of the upper surface is a round shape.

A part in FIG. 18 (*f*) that is the same as that in FIG. 18 (*e*) is not described again. As shown in FIG. 18 (*f*), a gap between the limiting magnet 230 and the magnet supporting plane 253 of the lower housing assembly 250 may be further filled with a thermally conductive adhesive, so as to improve heat transfer efficiency among the limiting magnet 230, the heat dissipation ring 240, and the lower housing assembly 250 in the wireless charger 200.

A part in FIG. 18 (*g*) that is the same as that in FIG. 18 (*a*) is not described again. As shown in FIG. 18 (*g*), the shielding assembly 280 is further disposed on a part of the lower surface of the limiting magnet 230. The shielding assembly 280 does not completely cover the lower surface of the limiting magnet 230, so as to prevent the shielding assembly 280 from preventing the limiting magnet 230 from transferring heat downwards.

A part in FIG. 18 (*h*) that is the same as that in FIG. 18 (*g*) is not described again. As shown in FIG. 18 (*h*), a gap among the shielding assembly 280 disposed on the lower surface of the limiting magnet 230, the limiting magnet 230, and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

A part in FIG. 18 (*i*) that is the same as that in FIG. 18 (*g*) is not described again. As shown in FIG. 18 (*i*), the shielding assembly 280 is further disposed on a part of the upper surface of the limiting magnet 230, so as to facilitate the assembler to mount the shielding assembly 280.

A part in FIG. 18 (*j*) that is the same as that in FIG. 18 (*i*) is not described again. As shown in FIG. 18 (*j*), a gap among the shielding assembly 280 disposed on the lower surface of the limiting magnet 230, the limiting magnet 230, and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

A part in FIG. 18 (*k*) that is the same as that in FIG. 18 (*i*) is not described again. As shown in FIG. 18 (*k*), the shielding assembly 280 is further disposed on the entire upper surface of the limiting magnet 230, so as to prevent a wireless charging signal radiated by the coil assembly 222 from being reflected to the upper surface of the limiting magnet 230.

A part in FIG. 18 (*l*) that is the same as that in FIG. 18 (*k*) is not described again. As shown in FIG. 18 (*l*), a gap among the shielding assembly 280 disposed on the lower surface of the limiting magnet 230, the limiting magnet 230, and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

A part in FIG. 18 (*m*) that is the same as that in FIG. 18 (*a*) is not described again. As shown in FIG. 18 (*m*), the shielding assembly 280 is further disposed on the entire lower surface of the limiting magnet 230, so as to prevent a wireless charging signal radiated by the coil assembly 222 from being reflected to the lower surface of the limiting magnet 230. In an embodiment, a gap between the shielding assembly 280 disposed on the lower surface of the limiting magnet 230 and the limiting magnet 230 may be further filled with a thermally conductive adhesive, so as to improve heat transfer efficiency between the limiting magnet 230 and the shielding assembly 280 in the wireless charger 200.

A part in FIG. 18 (*n*) that is the same as that in FIG. 18 (*m*) is not described again. As shown in FIG. 18 (*n*), a gap between the shielding assembly 280 disposed on the lower surface of the limiting magnet 230 and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

A part in FIG. 18 (*o*) that is the same as that in FIG. 18 (*m*) is not described again. As shown in FIG. 18 (*o*), the shielding assembly 280 is further disposed on a part of the upper surface of the limiting magnet 230, so as to prevent a wireless charging signal radiated by the coil assembly 222 from being reflected to the upper surface of the limiting magnet 230.

A part in FIG. 18 (*p*) that is the same as that in FIG. 18 (*o*) is not described again. As shown in FIG. 18 (*p*), a gap between the shielding assembly 280 disposed on the lower surface of the limiting magnet 230 and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

A part in FIG. 18 (*q*) that is the same as that in FIG. 18 (*m*) is not described again. As shown in FIG. 18 (*q*), the shielding assembly 280 is further disposed on the entire upper surface of the limiting magnet 230, so as to prevent the wireless charging signal radiated by the coil assembly 222 from being reflected to the upper surface of the limiting magnet 230.

A part in FIG. 18 (*r*) that is the same as that in FIG. 18 (*q*) is not described again. As shown in FIG. 18 (*r*), a gap between the shielding assembly 280 disposed on the lower surface of the limiting magnet 230 and the magnet supporting plane 253 of the lower housing assembly 250 may be further filled with a thermally conductive adhesive, so as to improve heat transfer efficiency among the limiting magnet 230, the shielding assembly 280, and the lower housing assembly 250 in the wireless charger 200.

The heat dissipation ring 240 in the wireless charger 200 provided in this embodiment is made of a material with a high thermal conductivity and a low electrical conductivity. The heat dissipation ring 240 is disposed on the magnet supporting plane 253. The heat dissipation ring 240 is in contact with one or more components such as the upper housing assembly 210, the magnetic sheet coil 220, the limiting magnet 230 and the circuit board 260, and may transfer heat of the components such as the upper housing assembly 210, the magnetic sheet coil 220, the limiting magnet 230 and the circuit board 260 to the lower housing assembly 250, so that a heat dissipation area of the wireless charger 200 is increased, and a heat dissipation capability of the wireless charger 200 is improved.

In an embodiment, the heat dissipation ring 240 may be a part of the lower housing assembly 250. The heat dissipation ring 240 and the lower housing assembly 250 are manufactured in an integrated molding manner. The heat dissipation ring 240 is located on the magnet supporting plane 253 of the lower housing assembly 250. The heat dissipation ring 240 and the lower housing assembly 250 are of an overall structure, so that a quantity of components of the wireless charger 200 can be reduced, and an assembly difficulty of the wireless charger 200 can be reduced.

In an embodiment, the heat dissipation ring 240 and the lower housing assembly 250 are of an overall structure, and the magnet supporting plane 253 of the lower housing assembly 250 may be unnecessarily provided with the isolation plate 254. In a process of manufacturing the heat dissipation ring 240 and the lower housing assembly 250, an inner radius of the heat dissipation ring 240 is made to be greater than an outer radius of the limiting magnet 230. In an embodiment, there is no isolation plate 254 in the concave structure of the lower housing assembly 250, so that a manufacturing difficulty of the lower housing assembly 250 can be greatly reduced.

In an embodiment, each of the heat dissipation ring 240 and the lower housing assembly 250 of the wireless charger 220 provided in this embodiment may be an independent component. A process of assembling the wireless charger 200 is as follows.

Step 1: Dispose the heat dissipation ring 240 on the magnet supporting plane 253 of the lower housing assembly 250. The heat dissipation ring 240 may be in contact with and fastened to the magnet supporting plane 253 of the lower housing assembly 250 and the heat dissipation ring 240 may be in contact with and fastened to the inner side wall that is in a shape of a toroidal column and that is of the coil supporting plane 252 of the lower housing assembly 250.

Step 2: Dispose the limiting magnet 230 on an inner side of the heat dissipation ring 240. The limiting magnet 230 may be in contact with and fastened to the magnet supporting plane 253 of the lower housing assembly 250 and the limiting magnet 230 may be in contact with and fastened to the inner side surface of the heat dissipation ring 240.

Step 3: Pass the cable 270 through the through hole 255 of the lower housing assembly 250 and enable the cable 270 to be electrically connected to the circuit board 260. The cable 270 may be fastened to an endpoint on an outer side surface of the circuit board 260 in a manner such as welding.

Step 4: Dispose the circuit board 260 on the circuit board supporting plane 256 of the lower housing assembly 250. A surface of a side of the circuit board 260 connected to the cable 270 may be in contact with and fastened to the circuit board supporting plane 256 and the cable 270 and a protrusion of the circuit board 260 may be trapped in the wiring trough 257 of the circuit board supporting plane 256.

Step 5: Dispose the magnetic sheet coil 220 on the coil supporting plane 252 of the lower housing assembly 250. The magnetic sheet coil 220 may be in contact with and fastened to the coil supporting plane 252 of the lower housing assembly 250 and a coil endpoint of the magnetic sheet coil 220 may be electrically connected to an endpoint of the circuit board 260. The magnetic sheet coil 220 is embedded between an outer side surface of the heat dissipation ring 240 and an inner side wall of the concave structure of the lower housing assembly 250. The limiting magnet 230, the heat dissipation ring 240, the magnetic sheet coil 220, and the inner side wall of the concave structure of the lower housing assembly 250 constitute a transverse limiting structure.

Step 6: Dispose the upper housing assembly 210 on the upper housing supporting plane 251 of the lower housing assembly 250. The upper housing assembly 210 may be in contact with and fastened to the upper housing supporting plane 251 of the lower housing assembly 250 and an upper surface of the upper housing assembly 210 and an upper surface of the lower housing assembly 250 may be on a same plane. A lower surface of the upper housing assembly 210 is in contact with an upper surface of the magnetic sheet coil 220. The upper housing assembly 210, the magnetic sheet coil 220 and the coil supporting plane 252 constitute a longitudinal limiting structure.

In a process of assembling the wireless charger 200 in this embodiment, the heat dissipation ring 240, the limiting magnet 230, the circuit board 260, the magnetic sheet coil 220, and the upper housing assembly 210 are sequentially fastened to the magnet supporting plane 253, the circuit board supporting plane 256, the coil supporting plane 252, and the upper housing supporting plane 251 of the lower housing assembly 250 in a bottom-up order, so as to implement assembly of the wireless charger 200.

In an embodiment, the heat dissipation ring 240 is a part of the lower housing assembly 250. In a process of assembling the wireless charger 200, the foregoing "step 1" may be omitted. The heat dissipation ring 240 and the lower housing assembly 250 are of an overall structure, so that a quantity of components of the wireless charger 200 can be reduced, so that the wireless charger 200 is assembled more easily, and assembly efficiency is improved.

In an embodiment, each of the heat dissipation ring 240 and the lower housing assembly 250 is an independent component. The lower housing assembly 250 includes a bottom plate and side plates. A process of assembling the wireless charger 200 is as follows.

Step 1: Dispose the heat dissipation ring 240 on the bottom plate of the lower housing assembly 250. The heat dissipation ring 240 may be in contact with and fastened to the bottom plate of the lower housing assembly 250. In this case, the bottom plate of the lower housing assembly 250 is the magnet supporting plane 253 of the lower housing assembly 250.

Step 2: Dispose the limiting magnet 230 on an inner side of the heat dissipation ring 240. The limiting magnet 230 may be in contact with and fastened to the bottom plate of the lower housing assembly 250 and the limiting magnet 230 may be in contact with and fastened to the inner side surface of the heat dissipation ring 240.

Step 3: Pass the cable 270 through the through hole 255 of the side plate of the lower housing assembly 250 and enable the cable 270 to be electrically connected to the circuit board 260. The cable 270 may be fastened to an endpoint on an outer surface of the circuit board 260 in a manner such as welding.

Step 4: Dispose the circuit board 260 on the circuit board supporting plane 256 of the lower housing assembly 250. A surface of a side of the circuit board 260 connected to the cable 270 may be in contact with and fastened to the circuit board supporting plane 256 and the cable 270 and a protrusion of the circuit board 260 may be trapped in the wiring trough 257 of the circuit board supporting plane 256.

Step 5: Dispose the magnetic sheet coil 220 on the coil supporting plane 252 of the side plate of the lower housing assembly 250. The magnetic sheet coil 220 may be in contact with and fastened to the coil supporting plane 252 of the side plate of the lower housing assembly 250 and a coil endpoint of the magnetic sheet coil 220 may be electrically connected to an endpoint of the circuit board 260.

It should be noted that, in the process of assembling the wireless charger 200, in "step 1" and "step 2", the bottom plate of the lower housing assembly 250 is assembled as an assembly line, and in "step 3", "step 4", and "step 5", the side plate of the lower housing assembly 250 is assembled as an assembly line. In the assembly process, the assembly line of the bottom plate of the lower housing assembly 250 and the assembly line of the side plate of the lower housing assembly 250 are not in a particular order. The two assembly lines may be performed simultaneously or may be performed one after the other. This is not limited herein.

Step 6: Dispose the side plate of the lower housing assembly 250 on the bottom plate of the lower housing assembly 250. The side plate of the lower housing assembly 250 may be embedded on the bottom plate of the lower housing assembly 250, so that the heat dissipation ring 240 is in contact with and fastened to the inner side wall that is in a shape of a toroidal column and that is of the coil supporting plane 252 of the side plate of the lower housing assembly 250, and the side plate of the lower housing assembly 250 may be in contact with and fastened to the bottom plate of the lower housing assembly 250.

Step 7: Dispose the upper housing assembly 210 on the upper housing supporting plane 251 of the side plate of the lower housing assembly 250. The upper housing assembly 210 may be in contact with and fastened to the upper housing supporting plane 251 of the side plate of the lower housing assembly 250, and the upper surface of the upper housing assembly 210 and the upper surface of the lower housing assembly 250 may be on a same plane.

In this embodiment, in a process of assembling the wireless charger, the lower housing assembly 250 is split into a bottom plate and a side plate, so that structure complexity of the lower housing assembly 250 is reduced, the wireless charger 200 is assembled more easily, and assembly efficiency is improved. The lower housing assembly 250 is split into the bottom plate and the side plate, the heat dissipation ring 240 and the limiting magnet 230 are fastened to the bottom plate of the lower housing assembly 250, and the circuit board 260 and the magnetic sheet coil 220 are fastened to the coil supporting plane 252 of the side plate of the lower housing assembly 250. In the assembly process, assembly is performed by using two assembly lines: the bottom plate of the housing assembly 250 and the side plate of the lower housing assembly 250, and then overall assembly is performed, so that a time for assembling the wireless charger 200 can be reduced, and a manufacturing capacity can be improved.

In addition, a heat conduction component of the wireless charger 200 is split into the upper housing assembly 210, the side plate of the lower housing assembly 250, the bottom plate of the lower housing assembly 250, and the heat dissipation ring 240. According to an actual requirement, the components are manufactured by using different materials, so that the wireless charger 200 can improve heat dissipation performance in a targeted manner and optimize costs.

In the wireless charger 200 provided in this embodiment, the upper housing assembly 210, the magnetic sheet coil 220, the limiting magnet 230, the heat dissipation ring 240, the lower housing assembly 250, and the circuit board 260 may be fastened to a pre-specified position by using a bonding agent, so that structural strength of the wireless charger 200 is enhanced, and product durability is improved. A gap among the upper housing assembly 210, the magnetic sheet coil 220, the limiting magnet 230, the heat dissipation ring 240, the lower housing assembly 250, and the circuit board 260 in the wireless charger 200 may be further filled with a thermally conductive adhesive, to improve structural strength and heat dissipation performance of the wireless charger 200.

In this embodiment, a concave structure is provided on an upper surface of the lower housing assembly 250 of the wireless charger 200, and the concave structure is coupled to the upper housing assembly 210 by using a bonding agent to form a cavity structure. The heat dissipation ring 240 is sleeved on the limiting magnet 230, and the magnetic sheet coil 220 is sleeved on the heat dissipation ring 240.

In an embodiment, the upper housing assembly 210 is fastened to the upper housing supporting plane 251 of the lower housing assembly 250 by using a bonding agent. A bonding agent may be provided on the upper housing supporting plane 251 or the lower surface of the upper housing assembly 210, the upper housing assembly 210 may be disposed on the upper housing supporting plane 251, and the lower surface of the upper housing assembly 210 may be fixedly connected to the upper housing supporting plane 251 by using the bonding agent. In this embodiment, the upper housing assembly 210 and the lower housing assembly 250 of the wireless charger 200 are fastened together by using the bonding agent. Compared with an existing screw fastening manner, the housing of the wireless charger 200 is more beautiful.

In this embodiment, the bonding agent may alternatively be an AB adhesive, a double-sided adhesive, or the like. This is not limited. The AB adhesive may be made of a material such as propylene acid, epoxy, or polyurethane.

In an embodiment, at least one of the limiting magnet 230 or the heat dissipation ring 240 is fastened to the bottom of the concave structure of the lower housing assembly 250 by using a bonding agent. In an embodiment, at least one of the limiting magnet 230 or the heat dissipation ring 240 is fastened to the lower surface of the upper housing assembly 210 by using a bonding agent.

In an embodiment, the heat dissipation ring 240 is fastened to the magnet supporting plane 253 of the lower housing assembly 250 by using a bonding agent. A bonding agent may be provided on the bottom of the heat dissipation ring 240, the heat dissipation ring 240 may be disposed at a specified position of the magnet supporting plane 253 of the lower housing assembly 250, and the bonding agent may fasten the heat dissipation ring 240 to the magnet supporting plane 253 of the lower housing assembly 250, so as to prevent the heat dissipation ring 240 from shaking inside the wireless charger 200 to generate an abnormal sound.

The heat dissipation ring 240 may be fastened to the magnet supporting plane 253 of the lower housing assembly 250, and there may be a gap between a side face of the heat dissipation ring 240 and the inner side wall of the concave structure of the lower housing assembly 250. The gap between the side face of the heat dissipation ring 240 and the inner side wall of the concave structure of the lower housing assembly 250 may be filled with a thermally conductive adhesive, so that a heat dissipation capability of the wireless charger 200 is improved. Correspondingly, the inner side wall of the concave structure of the lower housing assembly 250, the magnetic sheet coil 220, and the heat dissipation ring 240 constitute a transverse limiting structure, so as to prevent the magnetic sheet coil 220 and the heat dissipation ring 240 from shaking horizontally inside the wireless charger 200 to generate an abnormal sound, thereby improving structural reliability of the wireless charger 200.

In an embodiment, the limiting magnet 230 is fastened to the magnet supporting plane 253 of the lower housing assembly 250 by using a bonding agent. A bonding agent may be provided on a bottom of the limiting magnet 230, the limiting magnet 230 may be embedded in the heat dissipation ring 240, and the limiting magnet 230 may be in contact with the magnet supporting plane 253 of the lower housing assembly 250. The bonding agent fastens the limiting magnet 230 to the magnet supporting plane 253 of the lower housing assembly 250, so as to prevent the limiting magnet 230 from shaking inside the wireless charger 200 to generate an abnormal sound.

In an embodiment, the limiting magnet 230 is embedded in the heat dissipation ring 240, and there is a gap between an outer side surface of the limiting magnet 230 and an inner side face of the heat dissipation ring 240. The gap between the outer side surface of the limiting magnet 230 and the inner side face of the heat dissipation ring 240 may be filled with a thermally conductive adhesive. Correspondingly, the inner side wall of the concave structure of the lower housing assembly 250, the magnetic sheet coil 220, the heat dissipation ring 240 and the limiting magnet 230 constitute a transverse limiting structure, so as to prevent the magnetic sheet coil 220, the limiting magnet 230 and the heat dissipation ring 240 from shaking inside the wireless charger 200 to generate an abnormal sound, thereby improving structural reliability of the wireless charger 200. In addition, the thermally conductive adhesive may be filled in the gap between the outer side surface of the limiting magnet 230 and the inner side face of the heat dissipation ring 240, so as to improve a heat dissipation capability of the wireless charger 200.

In an embodiment, the circuit board 260 is fastened to the receiving cavity by using a thermally conductive adhesive. The magnetic sheet coil 220 may be disposed on the coil supporting plane 252, and the circuit board 260 may be disposed between the magnetic sheet coil 220 and the bottom of the concave structure of the lower housing assembly 250. The magnetic sheet coil 220 and the bottom of the concave structure of the lower housing assembly 250 constitute the receiving cavity. A gap among the magnetic sheet coil 220, the bottom of the concave structure of the lower housing assembly 250, and the circuit board 260 is filled with a thermally conductive adhesive. The thermally conductive adhesive fastens the circuit board 260 in the receiving cavity, so as to prevent the circuit board 260 from shaking inside the wireless charger 200 to generate an abnormal sound, and further avoid an open circuit problem caused by movement of the circuit board 260 in the receiving cavity, thereby improving reliability of the wireless charger 200.

In an embodiment, the circuit board 260 is fastened to the lower surface of the magnetic sheet coil 220 by using a bonding agent. A bonding agent may be provided on a surface of the circuit board 260 or a lower surface of the magnetic sheet coil 220, and the bonding agent may fasten the circuit board 260 on the lower surface of the magnetic sheet coil 220, so as to prevent the circuit board 260 from shaking inside the wireless charger 200 to generate an abnormal sound, and further avoid an open circuit problem caused by movement of the circuit board 260 in the receiving cavity, thereby improving reliability of the wireless charger 200.

In this embodiment, the coil supporting plane 252 is provided in the concave structure of the lower housing assembly 250. The coil supporting plane 252 is used to support the magnetic sheet coil 220. The coil supporting plane 252 is close to the upper surface of the lower housing assembly 250.

In an embodiment, the magnetic sheet coil 220 is fastened to the coil supporting plane 252 of the lower housing assembly 250 by using a bonding agent. A bonding agent may be provided on the coil supporting plane 252 and the magnetic sheet coil 220 may be disposed on the coil supporting plane 252. The bonding agent fastens the magnetic sheet coil 220 to the coil supporting plane 252 of the lower housing assembly 250, so as to prevent the magnetic sheet coil 220 from shaking inside the wireless charger 200 to generate an abnormal sound.

In an embodiment, an upper surface of the magnetic sheet coil 220 is in contact with the lower surface of the upper housing assembly 210. The upper surface of the magnetic sheet coil 220 is a surface that is of the magnetic sheet coil 220 and that is close to the upper housing assembly 210, and the lower surface of the upper housing assembly 210 is a surface that is of the upper housing assembly 210 and that constitutes the cavity structure. The coil supporting plane 252 supports the magnetic sheet coil 220, and the upper housing assembly 210, the magnetic sheet coil 220 and the coil supporting plane 252 constitute a longitudinal limiting structure, so as to prevent the magnetic sheet coil 220 from shaking inside the wireless charger 200 to generate an abnormal sound.

In an embodiment, a gap among the lower surface of the upper housing assembly 210, the concave structure of the lower housing assembly 250, and the magnetic sheet coil 220 is filled with a thermally conductive adhesive, and the upper housing assembly 210, the magnetic sheet coil 220 and the coil supporting plane 252 constitute a longitudinal limiting structure, so as to prevent the magnetic sheet coil 220 from shaking inside the wireless charger 200 and improve heat dissipation efficiency of the wireless charger 200.

In an embodiment, the coil supporting plane 252 is of a fence-shaped structure, and a thermally conductive adhesive is filled among a plurality of fences of the fence-shaped structure. The coil supporting plane 252 may include a fence-shaped support body. The fence-shaped support body includes one arc-shaped fence and a plurality of column-shaped fences. A gap among the column-shaped fences, the arc-shaped fence, and the inner side wall of the concave structure of the lower housing assembly 250 is filled with a thermally conductive adhesive, so that a heat dissipation capability of the wireless charger 200 is improved.

In an embodiment, the lower housing assembly 250 includes two parts: a bottom plate and a side plate. The side plate of the lower housing assembly 250 is fastened to the bottom plate of the lower housing assembly 250 by using a bonding agent. The bonding agent used between the bottom plate of the lower housing assembly 250 and the side plate of the lower housing assembly 250 may be an AB adhesive. The heat dissipation ring 240 and the limiting magnet 230 are fastened to the bottom plate of the lower housing assembly 250 by using a double-sided adhesive.

A plurality of components in the wireless charger 200 provided in this embodiment may be fastened by using a bonding agent, so as to enhance structural strength of the wireless charger 200 and improve product durability. In addition, a gap among the plurality of components of the wireless charger 200 is filled with a thermally conductive adhesive, so as to improve a heat dissipation capability of the wireless charger 200.

In this embodiment, powder of a ceramic material is used as a bonding agent in the wireless charger 200, and another type of bonding agent such as a white adhesive or a double-sided adhesive is not needed, so that types of bonding agents can be reduced, and manufacturing costs of the wireless charger 200 can be reduced. In addition, the powder of the ceramic material has a good heat conductivity, which further improves a heat dissipation capability of the wireless charger 200.

In this embodiment, when the wireless charger 200 performs wireless charging, the magnetic sheet coil 220 generates a large amount of heat. A wireless charging signal generated by the wireless charger 200 generates a vortex on the limiting magnet 230, and a large amount of heat is generated in the limiting magnet 230. The circuit board 260 works for a long time, and various components of the circuit board 260 generate heat.

In this embodiment, components that generate heat in the wireless charger 200 may be the magnetic sheet coil 220 and the circuit board 260. In a process of converting electrical energy into a wireless charging signal, the magnetic sheet coil 220 generates a large amount of heat. Heat generated by the circuit board 260 is far less than that of the magnetic sheet coil 220 and the limiting magnet 230. Therefore, a problem to be resolved may be to reduce heat generated by the magnetic sheet coil 220 and the limiting magnet 230.

In order to improve a heat dissipation capability of the wireless charger 200, the upper housing assembly 210 and the lower housing assembly 250 of the wireless charger 200 may be made of materials with a high thermal conductivity. In the embodiments, the material with a high thermal conductivity may include ceramic, thermally conductive plastic, and the like.

In an embodiment, the upper housing assembly 210 and the lower housing assembly 250 may be made of a material with a low electrical conductivity. In a process in which the magnetic sheet coil 220 converts electrical energy into a wireless charging signal, the housing of the wireless charger 200 cannot transmit electrical energy, and no electric leakage occurs.

Figure 19:
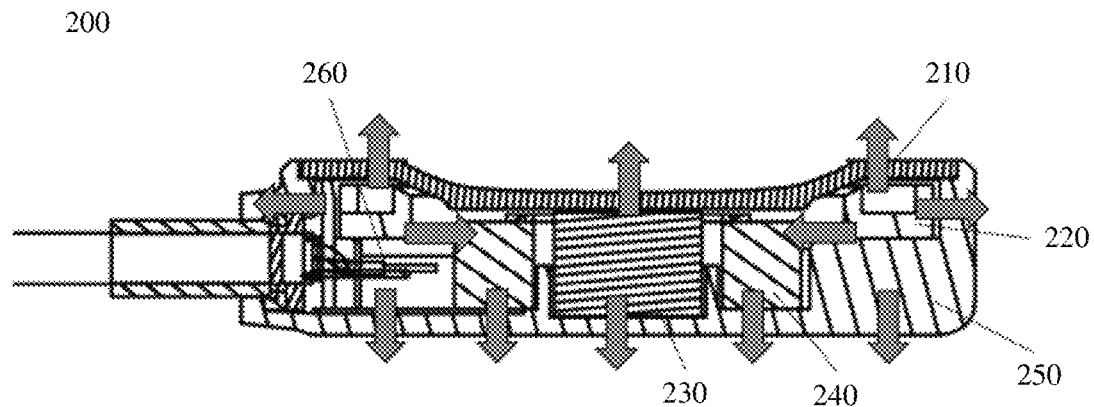
FIG. 19 is a schematic diagram of heat transfer among heat-emitting components such as a magnetic sheet coil and a limiting magnet of a wireless charger according to an embodiment.

FIG. 19 is a schematic diagram of heat transfer among heat-emitting components such as a magnetic sheet coil and a limiting magnet of a wireless charger according to an embodiment. In this embodiment, a wireless charger 200 may include an upper housing assembly 210, a magnetic sheet coil 230, a heat dissipation ring 240, and a lower housing assembly 250. A concave structure is provided on an upper surface of the lower housing assembly 250, and the concave structure of the lower housing assembly 250 is coupled to the upper housing assembly 210 form a cavity structure. The magnetic sheet coil 230 is sleeved outside the heat dissipation ring 240. A gap among the upper housing assembly 210, the concave structure of the lower housing assembly 250, the magnetic sheet coil 230, and the heat dissipation ring 240 is filled with a thermally conductive adhesive.

As shown in FIG. 19, the magnetic sheet coil 220 and the heat dissipation ring 240 are disposed in the concave structure of the lower housing assembly 250 of the wireless charger 200. The heat dissipation ring 240 is disposed in an annular structure of the magnetic sheet coil 220, and the magnetic sheet coil 220 is sleeved outside the heat dissipation ring. An outer side surface of the heat dissipation ring 240 is coupled to the magnetic sheet coil 220, and the outer side surface of the heat dissipation ring 240 is in contact with an inner side surface of the magnetic sheet coil 220. An upper surface of the heat dissipation ring 240 is coupled to a lower surface of the upper housing assembly 210, and a lower surface of the heat dissipation ring 240 is coupled to a bottom of the concave structure of the lower housing assembly 250. The upper surface of the heat dissipation ring 240 is a surface that is of the heat dissipation ring 240 and that is close to the upper housing assembly 210, the lower surface of the heat dissipation ring 240 is a surface that is of the heat dissipation ring 240 and that is close to the bottom of the concave structure of the lower housing assembly 250, and the lower surface of the upper housing assembly 210 is a surface that is of the upper housing assembly 10 and that constitutes the cavity structure.

In an embodiment, the heat dissipation ring 240 is fastened between the lower surface of the upper housing assembly 210 and the bottom of the concave structure of the lower housing assembly 250. In an embodiment, a thermally conductive adhesive is provided between the upper surface of the heat dissipation ring 240 and the upper housing assembly 210, and a thermally conductive adhesive is provided between the lower surface of the heat dissipation ring 240 and the bottom of the concave structure of the lower housing assembly 250. The heat dissipation ring 210 is configured to conduct heat of the upper housing assembly 210 and the magnetic sheet coil 220 to the bottom of the concave structure of the lower housing assembly 250.

In an embodiment, the heat dissipation ring 240 and the lower housing assembly 250 are made of a high thermally conductive material. Heat generated on the inner side surface of the magnetic sheet coil 220 may be transferred to the heat dissipation ring 240 by using the thermally conductive adhesive. The heat of the heat dissipation ring 240 is transferred to the lower housing assembly 250 by using the thermally conductive adhesive. The lower housing assembly 250 performs heat exchange with external gas, and transfers heat of the magnetic sheet coil 220 to the external gas, so as to reduce a temperature of the wireless charger 200.

As shown in FIG. 19, a coil supporting plane 252 is provided in the concave structure of the lower housing assembly 250. The magnetic sheet coil 220 is disposed on the coil supporting plane 252. In an embodiment, an outer side surface of the magnetic sheet coil 220 is in contact with an inner side wall of the concave structure of the lower housing assembly 250, and a lower surface of the magnetic sheet coil 220 is in contact with the coil supporting plane 252 of the lower housing assembly 250. Heat generated by the magnetic sheet coil 220 may be quickly transferred to the lower housing assembly 250.

In an embodiment, the lower housing assembly 250 is made of a high thermally conductive material. Heat generated on the outer side surface and the lower surface of the magnetic sheet coil 220 may be transferred to the lower housing assembly 250 by using the thermally conductive adhesive. The lower housing assembly 250 performs heat exchange with external gas, and transfers heat of the magnetic sheet coil 220 to the external gas, so as to reduce a temperature of the wireless charger 200.

In an embodiment, the magnetic sheet coil 220 is coupled to the lower surface of the upper housing assembly 210, and a thermally conductive adhesive is provided between the magnetic sheet coil 220 and the lower surface of the upper housing assembly 210. In an embodiment, the lower surface of the upper housing assembly 210 of the wireless charger 200 is in contact with an upper surface of the magnetic sheet coil 220. Heat generated on the upper surface of the magnetic sheet coil 220 may be transferred to the upper housing assembly 210 by using the thermally conductive adhesive. The upper housing assembly 210 performs heat exchange with external gas, and transfers heat of the magnetic sheet coil 220 to the external gas, so as to reduce a temperature of the wireless charger 200.

As shown in FIG. 19, the wireless charger 200 is further provided with a limiting magnet 230. The limiting magnet 230 is disposed inside the heat dissipation ring 240, an upper surface of the limiting magnet 230 is coupled to the lower surface of the upper housing assembly 210, and a lower surface of the limiting magnet 230 is coupled to the bottom of the concave structure of the lower housing assembly 250. The upper surface of the limiting magnet 230 is a surface that is of the limiting magnet 230 and that is close to the upper housing assembly 210, and the lower surface of the limiting magnet 230 is a surface that is of the limiting magnet 230 and that is close to the bottom of the concave structure of the lower housing assembly 250.

In an embodiment, the limiting magnet 230 is fastened between the lower surface of the upper housing assembly 210 and the bottom of the concave structure of the lower housing assembly 250. In an embodiment, a thermally conductive adhesive is provided between the upper surface of the limiting magnet 230 and the lower surface of the upper housing assembly 210, and a thermally conductive adhesive is provided between the lower surface of the limiting magnet 230 and the bottom of the concave structure of the lower housing assembly 250. A thermally conductive adhesive is provided between the heat dissipation ring 240 and the limiting magnet 230. The limiting magnet 230 is configured to transfer heat of the upper housing assembly 210 to the bottom of the concave structure of the lower housing assembly 250, so as to greatly improve a heat dissipation capability of the wireless charger 200 and reduce a temperature of the wireless charger 200.

In an embodiment, a side face of the limiting magnet 230 is in contact with an inner side surface of the heat dissipation ring 240, and heat generated by the limiting magnet 230 may be quickly transferred to the heat dissipation ring 240.

As shown in FIG. 6, a plurality of heat dissipation holes 258 may be provided on the magnet supporting plane 253 of the lower housing assembly 250. The heat dissipation holes 258 are located at a position at which the limiting magnet 230 is fastened in the magnet supporting plane 253. Heat of the limiting magnet 230 may be exchanged with external gas by using the heat dissipation holes 258, and the heat of the limiting magnet 230 is transferred to the external gas, so as to reduce a temperature of the wireless charger 200. In another embodiment, there may be any quantity of heat dissipation holes 258. The heat dissipation hole 258 may be in a shape of an ellipse or a polygon, or in another shape.

In an embodiment, a radius of a protrusion structure on the lower surface of the upper housing assembly 210 is not greater than a radius of an inner side of the magnetic sheet assembly 221 of the magnetic sheet coil 220, and the radius of the protrusion structure on the lower surface of the upper housing assembly 210 is not less than a radius of the limiting magnet 230. The upper housing assembly 210 is disposed on the upper housing supporting plane 251 of the lower housing assembly 250. The upper housing assembly 210 is not only in contact with the upper surface of the magnetic sheet coil 220, but also in contact with the upper surface of the limiting magnet 230 at a bottom of the protrusion structure of the upper housing assembly 210. Heat of the limiting magnet 230 is transferred to the upper housing assembly 210. The upper housing assembly 210 performs heat exchange with external gas, so as to reduce a temperature of the wireless charger 200.

In an embodiment, the radius of the protrusion structure on the lower surface of the upper housing assembly 210 is not less than a radius of the heat dissipation ring 240. The upper housing assembly 210 is disposed on the upper housing supporting plane 251 of the lower housing assembly 250. The upper housing assembly 210 is not only in contact with the upper surface of the magnetic sheet coil 220, but also in contact with the limiting magnet 230 and the heat dissipation ring 240. Heat of the limiting magnet 230 and the heat dissipation ring 240 is transferred to the upper housing assembly 210. The upper housing assembly 210 performs heat exchange with external gas, so as to reduce a temperature of the wireless charger 200.

In this embodiment, the upper surface of the limiting magnet 230 and the upper surface of the heat dissipation ring 240 may be in contact with the upper housing assembly 210. The lower surface of the limiting magnet 230 and the lower surface of the heat dissipation ring 240 are in contact with the bottom of the concave structure of the lower housing assembly 250. Heat generated by the limiting magnet 230 may be transferred to the upper housing assembly 210 and the lower housing assembly 250, so that a heat dissipation capability of the wireless charger 200 can be further improved.

As shown in FIG. 19, a lower surface of the circuit board 260 is in contact with the magnet supporting plane 253 of the lower housing assembly 250, or an upper surface of the circuit board 260 is in contact with the magnetic sheet coil 220. Heat generated by the circuit board 260 is transferred to the magnetic sheet coil 220, the heat dissipation ring 240, and the lower housing assembly 250. In an embodiment, a temperature of the magnetic sheet coil 220 is higher than that of the circuit board 260, and the circuit board 260 does not transfer heat to the magnetic sheet coil 220, and instead absorbs the heat of the magnetic sheet coil 220. In this case, heat generated by the circuit board 260 is transferred to the lower housing assembly 250. In an embodiment, the temperature of the circuit board 260 is higher than that of the magnetic sheet coil 220, and heat generated by the circuit board 260 is transferred to the magnetic sheet coil 220 and the lower housing assembly 250. Heat generated by the circuit board 260 and heat generated by the magnetic sheet coil 220 are exchanged together by using the housing of the wireless charger 200, so as to reduce a temperature of the wireless charger 200.

In this embodiment, the upper surface of the magnetic sheet coil 220 of the wireless charger 200 may be in contact with the upper housing assembly 210, the outer side surface of the magnetic sheet coil 220 and the lower surface of the magnetic sheet coil 220 may be in contact with the lower housing assembly 250, and an inner side surface of the magnetic sheet coil 220 may be in indirect contact with the upper housing assembly 210 and the lower housing assembly 250 by using the limiting magnet 230 and the heat dissipation ring 240. Heat generated by the magnetic sheet coil 220 may be transferred from all sides to the housing of the wireless charger 200, so that a heat dissipation capability of the wireless charger 200 is greatly improved. The housing of the wireless charger 200 performs heat exchange with external gas, so as to reduce a temperature of the wireless charger 200.

Figure 20:
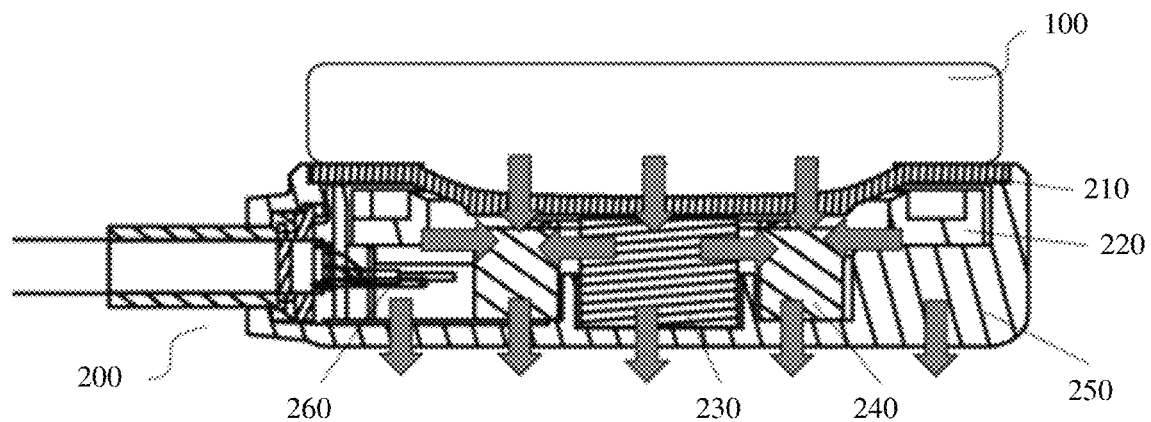
FIG. 20 is a schematic diagram of heat transfer when an electronic device is disposed on a wireless charger according to an embodiment.

FIG. 20 is a schematic diagram of heat transfer when an electronic device is disposed on a wireless charger according to an embodiment. As shown in FIG. 20, when a wireless charger 200 wirelessly charges an electronic device 100, the electronic device 100 generates heat. The electronic device 100 has a relatively large quantity of components and a complex structure, and an excessively high temperature of the electronic device 100 needs to be prevented. Therefore, the electronic device 100 is overheated, causing an excessively high temperature, and wireless charging power needs to be reduced or wireless charging needs to be stopped. Consequently, a wireless charging speed of the electronic device 100 is affected.

As shown in FIG. 20, in a wireless charging process, the electronic device 100 is disposed on an upper surface of an upper housing assembly 210 of the wireless charger 200. A protrusion structure of the electronic device 100 is embedded into a concave structure 211 of the upper housing assembly 210, and the protrusion structure of the electronic device 100 may be in contact with the concave structure 211 of the upper housing assembly 210. A periphery of an upper surface of the upper housing assembly 210 is in contact with a lower surface of the electronic device 100. Heat of the electronic device 100 is transferred to a housing of the wireless charger 200, so that a heat dissipation area of the electronic device 100 is increased, and reduction of a temperature of the electronic device 100 is accelerated.

After heat exchange is performed between the upper housing assembly 210 and the electronic device 100, some heat of the upper housing assembly 210 is directly exchanged with surrounding gas, and heat of the electronic device 100 is transferred to the surrounding gas of the upper housing assembly 210, so that a temperature of the electronic device 100 is reduced. The upper housing assembly 210 may also transfer the heat to a lower housing assembly 250. An outer surface area of the lower housing assembly 250 is relatively large, and the heat of the electronic device 100 can be quickly transferred to surrounding gas, so as to quickly reduce a temperature of the electronic device 100.

In an embodiment, the upper housing assembly 210 and the lower housing assembly 250 are made of a high thermally conductive material. A thermally conductive coefficient of the upper housing assembly 210 and the lower housing assembly 250 is higher than that of the electronic device 100, and thermal resistance of the upper housing assembly 210 and the lower housing assembly 250 is lower than that of the electronic device 100. The upper housing assembly 210 can quickly absorb heat of the electronic device 100 and transfer the heat to surrounding gas and the lower housing assembly 250, so that a heat dissipation capability of the electronic device 100 can be improved. The heat of the electronic device 100 is dissipated through a heat dissipation channel of "the electronic device 100→the upper housing assembly 210 of the wireless charger 200→the lower housing assembly 250 of the wireless charger 200", so as to quickly reduce a temperature of the electronic device 100, thereby improving a wireless charging speed of the electronic device 100.

In an embodiment, a gap among the upper housing assembly 250, a limiting magnet 230, a heat dissipation ring 240, and the lower housing assembly 250 of the wireless charger 200 is filled with a thermally conductive adhesive. The upper housing assembly 210 absorbs heat of the electronic device 100, and heat of the upper housing assembly 210 may be transferred to a side face of the lower housing assembly 250 and a bottom plate of the lower housing assembly 250 by using the thermally conductive adhesive. In this embodiment, heat of the electronic device 100 is dissipated through a heat dissipation channel of "the electronic device 100→the upper housing assembly 210 of the wireless charger 200→the thermally conductive adhesive→the lower housing assembly 250 of the wireless charger 200", so as to quickly reduce a temperature of the electronic device 100, thereby improving a wireless charging speed of the electronic device 100.

In an embodiment, a protrusion structure 212 of the upper housing assembly 210 is in contact with an upper surface of the limiting magnet 230 and an upper surface of the heat dissipation ring 240 by using a thermally conductive adhesive or in a direct manner, a lower surface of the limiting magnet 230 is in contact with a bottom of a concave structure of the lower housing assembly 250, and a lower surface of the heat dissipation ring 240 is in contact with the bottom of the concave structure of the lower housing assembly 250.

After the upper housing assembly 210 absorbs heat of the electronic device 100, heat of the upper housing assembly 210 is transferred to the limiting magnet 230 and the heat dissipation ring 240. Heat of the limiting magnet 230 and the heat dissipation ring 240 is transferred to the bottom of the concave structure of the lower housing assembly 250. In another embodiment, the upper housing assembly 210 may transfer heat to the bottom of the concave structure of the lower housing assembly 250 by using one of the limiting magnet 230 and the heat dissipation ring 240.

In this embodiment, heat of the electronic device 100 is dissipated through a heat dissipation channel of "the electronic device 100→the upper housing assembly 210 of the wireless charger 200→the limiting magnet 230 and/or the heat dissipation ring 240→the lower housing assembly 250 of the wireless charger 200", so as to quickly reduce a temperature of the electronic device 100, thereby improving a wireless charging speed of the electronic device 100.

When wirelessly charging the electronic device 100, the wireless charger 200 provided in this embodiment may further dissipate heat for the electronic device 100, to improve a heat dissipation capability of the electronic device 100, thereby improving a wireless charging speed of the electronic device 100. During experimental simulation, when the wireless charger 200 provided in this embodiment wirelessly charges the electronic device 100, a time for charging the electronic device 100 from an electric quantity of 0 to 100% may be reduced by 25 minutes, and a charging speed is obviously improved.

The wireless charger provided in this embodiment may include an upper housing assembly and a lower housing assembly. A plurality of supporting planes, such as an upper housing supporting plane, a coil supporting plane, a magnet supporting plane, and a circuit board supporting plane, may be disposed in the lower housing assembly. The upper housing supporting plane supports the upper housing assembly. The coil supporting plane supports the magnetic sheet coil. The magnet supporting plane supports the limiting magnet and the heat dissipation ring. The circuit board supporting plane supports a circuit board 260. The plurality of supporting planes of the wireless charger may support the components at different positions, so as to avoid overlapping of the components. If the wireless charger is affected by an external force, all the components that are overlapped together may be damaged. As a result, reliability of the wireless charger 200 is reduced.

The wireless charger provided in this embodiment may include an upper housing assembly, a lower housing assembly, and a magnetic sheet coil. A concave structure is provided on an upper surface of the lower housing assembly, and the concave structure is coupled to the upper housing assembly to form a cavity structure. The cavity structure accommodates the magnetic sheet coil. The magnetic sheet coil includes a magnetic sheet assembly and a coil assembly. A circular groove is provided on an upper surface of the magnetic sheet assembly and is used to accommodate the coil assembly. The coil assembly converts electrical energy into a wireless charging signal and radiates the wireless charging signal to the surroundings. The wireless charging signal is radiated in a specified direction under the limitation of the magnetic sheet assembly. The magnetic sheet assembly limits a radiation direction of the wireless charging signal, to avoid a temperature rise of the wireless charger due to a fact that the wireless charging signal generated by the coil assembly forms a vortex on another component of the wireless charger.

The wireless charger provided in this embodiment may include an upper housing assembly, a lower housing assembly, a magnetic sheet coil, a limiting magnet, and a shielding assembly. A concave structure is provided on an upper surface of the lower housing assembly, and the concave structure is coupled to the upper housing assembly to form a cavity structure. The cavity structure accommodates the magnetic sheet coil, the limiting magnet, and the shielding assembly. The shielding assembly is disposed between the magnetic sheet coil and the limiting magnet. The shielding assembly may prevent a wireless charging signal generated by the coil assembly from forming a vortex on the limiting magnet, and avoid a temperature rise of the wireless charger.

The wireless charger provided in this embodiment may include an upper housing assembly, a lower housing assembly, and a heat dissipation ring. A concave structure is provided on an upper surface of the lower housing assembly, and the concave structure is coupled to the upper housing assembly to form a cavity structure. The cavity structure accommodates the heat dissipation ring. An upper surface of the heat dissipation ring is coupled to the upper housing assembly. A lower surface of the heat dissipation ring is coupled to a bottom of the concave structure of the lower housing assembly. The heat dissipation ring may transfer heat of the wireless charger by using the upper housing assembly and the lower housing assembly, so as to improve a heat dissipation capability of the wireless charger.

The wireless charger provided in this embodiment may include an upper housing assembly, a lower housing assembly, and a heat dissipation ring. A concave structure is provided on an upper surface of the lower housing assembly, and the concave structure is coupled to the upper housing assembly to form a cavity structure. The cavity structure accommodates the heat dissipation ring. An upper surface of the heat dissipation ring is coupled to the upper housing assembly. A lower surface of the heat dissipation ring is coupled to a bottom of the concave structure of the lower housing assembly. Heat of the electronic device is transferred to the upper housing assembly, and the heat dissipation ring may transfer the heat of the upper housing assembly to the bottom of the lower housing assembly, so that a heat dissipation area of the electronic device is increased, and a heat dissipation capability of the electronic device is improved.

The wireless charger provided in this embodiment may include an upper housing assembly, a lower housing assembly, a magnetic sheet coil, and a heat dissipation ring. A concave structure is provided on an upper surface of the lower housing assembly, and the concave structure is coupled to the upper housing assembly to form a cavity structure. The cavity structure accommodates the magnetic sheet coil and the heat dissipation ring. The heat dissipation ring is embedded in the magnetic sheet coil and is in contact with the magnetic sheet coil. An upper surface of the heat dissipation ring is coupled to the upper housing assembly. A lower surface of the heat dissipation ring is coupled to a bottom of the concave structure of the lower housing assembly. Heat of the electronic device is transferred to the upper housing assembly, and the heat dissipation ring may transfer the heat of the upper housing assembly to the bottom of the lower housing assembly, so that a heat dissipation area of the electronic device is increased, and heat dissipation capabilities of the wireless charger and the electronic device are improved.

The wireless charger provided in this embodiment may include an upper housing assembly, a lower housing assembly, a magnetic sheet coil, and a limiting magnet. A concave structure is provided on an upper surface of the lower housing assembly, and the concave structure is coupled to the upper housing assembly to form a cavity structure. The cavity structure accommodates the magnetic sheet coil and the limiting magnet. The magnetic sheet coil and the limiting magnet are fastened on the upper housing assembly and the lower housing assembly, to prevent each component from shaking inside the wireless charger to generate an abnormal sound. In addition, components such as the magnetic sheet coil and the limiting magnet of the wireless charger are fastened together by using a bonding agent, so as to enhance structural strength of the wireless charger and improve durability of the product. In addition, a gap between the components of the wireless charger is filled with a thermally conductive adhesive, so as to improve a heat dissipation capability of the wireless charger.

The wireless charger provided in this embodiment may include an upper housing assembly, a lower housing assembly, a magnetic sheet coil, a limiting magnet, and a heat dissipation ring. A concave structure is provided on an upper surface of the upper housing assembly. A protrusion structure is provided on a lower surface of the upper housing assembly. A circular notch is further provided on a lower surface of the upper housing assembly.

In this embodiment, the concave structure may be provided on the upper surface of the upper housing assembly, so that the concave structure on the upper surface of the upper housing assembly may be coupled to a protrusion structure of the electronic device. This can reduce a distance between the electronic device and the wireless charger and reduce an electrical energy loss during wireless charging. The protrusion structure is provided on the lower surface of the upper housing assembly, so that the upper housing assembly is in contact with the heat dissipation ring and the limiting magnet, thereby improving a heat dissipation capability of the wireless charger. A circular notch is further provided on the lower surface of the upper housing assembly, so that the magnetic sheet coil is embedded in the circular notch, thereby increasing a height of the magnetic sheet coil. In this case, a quantity of coil turns that can be accommodated in the magnetic sheet coil is increased, and power of the wireless charger is increased.

The wireless charger provided in this embodiment may include an upper housing assembly, a lower housing assembly, a magnetic sheet coil, and a limiting magnet. The lower housing assembly includes a side plate and a bottom plate, and the bottom plate of the lower housing assembly is fastened to one opening of the side plate of the lower housing assembly, to form a concave structure. The upper housing assembly is fastened to the other opening of the side plate of the lower housing assembly, to form a cavity structure. The cavity structure accommodates the magnetic sheet coil and the limiting magnet. The lower housing assembly may be split into two parts: a bottom plate and a side plate, and may be divided into two components for manufacturing, so that a manufacturing difficulty of the lower housing assembly is reduced.

Types, quantities, shapes, installation manners, structures, and the like of components of the wireless charger provided in embodiments may not be limited to the foregoing embodiments. All solutions may fall within the scope of the embodiments. Any one or more embodiments or figures combined in a proper manner shall fall within the scope of the embodiments.

Finally, it is noted that the foregoing embodiments are merely used to describe some solutions. A person of ordinary skill in the art should understand that, although described in detail with reference to the foregoing embodiments, the solutions described in the foregoing embodiments may still be modified, or some features thereof may be equivalently replaced. Such modifications or replacements do not make the essence of the corresponding solutions depart from the scope of the embodiments.

The invention claimed is:

1. A wireless charger, comprising:
    an upper housing assembly;
    a lower housing assembly;
    a magnetic sheet coil; and
    a heat dissipation ring, wherein a concave structure is provided on an upper surface of the lower housing assembly, the concave structure is coupled to the upper housing assembly to form a cavity structure, the magnetic sheet coil is sleeved outside the heat dissipation ring, and a gap among the upper housing assembly, the concave structure, the magnetic sheet coil, and the heat dissipation ring is filled with a thermally conductive adhesive;
    an upper surface of the heat dissipation ring is coupled to a lower surface of the upper housing assembly, a lower surface of the heat dissipation ring is coupled to a bottom of the concave structure of the lower housing assembly, and an outer side surface of the heat dissipation ring is coupled to the magnetic sheet coil, wherein the upper surface of the heat dissipation ring is a surface that is of the heat dissipation ring and that is close to the upper housing assembly, the lower surface of the heat dissipation ring is a surface that is of the heat dissipation ring and that is close to the bottom of the concave structure of the lower housing assembly, and the lower surface of the upper housing assembly is a surface that is of the upper housing assembly and that constitutes the cavity structure; and
    the heat dissipation ring is configured to conduct heat of the upper housing assembly and the magnetic sheet coil to the bottom of the concave structure of the lower housing assembly.

2. The wireless charger according to claim 1, further comprising:
    a limiting magnet, wherein the limiting magnet is disposed inside the heat dissipation ring, an upper surface of the limiting magnet is coupled to the lower surface of the upper housing assembly, and a lower surface of the limiting magnet is coupled to the bottom of the concave structure of the lower housing assembly, wherein the upper surface of the limiting magnet is a surface that is of the limiting magnet and that is close to the upper housing assembly, and the lower surface of the limiting magnet is a surface that is of the limiting magnet and that is close to the bottom of the concave structure of the lower housing assembly; and
    the limiting magnet is configured to transfer heat of the upper housing assembly to the bottom of the concave structure of the lower housing assembly.

3. The wireless charger according to claim 2, wherein a thermally conductive adhesive is provided between the upper surface of the limiting magnet and the lower surface of the upper housing assembly, and a thermally conductive adhesive is provided between the lower surface of the limiting magnet and the bottom of the concave structure of the lower housing assembly.

4. The wireless charger according to claim 2, wherein a thermally conductive adhesive is provided between the heat dissipation ring and the limiting magnet.

5. The wireless charger according to claim 1, wherein a thermally conductive adhesive is provided between the upper surface of the heat dissipation ring and the upper housing assembly, and a thermally conductive adhesive is provided between the lower surface of the heat dissipation ring and the bottom of the concave structure of the lower housing assembly.

6. The wireless charger according to claim 1, wherein the magnetic sheet coil is coupled to the lower surface of the upper housing assembly, and a thermally conductive adhesive is provided between the magnetic sheet coil and the lower surface of the upper housing assembly.

7. The wireless charger according to claim 6, wherein the magnetic sheet coil further comprises:

a magnetic sheet assembly; and a coil assembly, a circular groove is provided in the magnetic sheet assembly to accommodate the coil assembly, and a thermally conductive adhesive is provided in the circular groove of the magnetic sheet assembly.

8. The wireless charger according to claim 1, wherein the heat dissipation ring is made of a high thermally conductive material.

9. The wireless charger according to claim 1, wherein the upper housing assembly is made of a high thermally conductive material, and when the wireless charger is configured to wirelessly charges an electronic device, the upper housing assembly is configured to conducts heat of the electronic device to the lower housing assembly by using the heat dissipation ring.

10. The wireless charger according to claim 9, wherein the upper housing assembly is configured to conducts the heat of the electronic device to the lower housing assembly.

11. The wireless charger according to claim 9, wherein the upper housing assembly is configured to conducts the heat of the electronic device to the lower housing assembly by using the thermally conductive adhesive.

12. The wireless charger according to claim 1, wherein the heat dissipation ring is configured to conduct heat of the magnetic sheet coil to the lower housing assembly.

13. The wireless charger according to claim 1, wherein the limiting magnet is configured to conduct the heat of the magnetic sheet coil to the lower housing assembly.

14. The wireless charger according to claim 1, wherein the thermally conductive adhesive is configured to conduct the heat of the magnetic sheet coil to the lower housing assembly.

15. The wireless charger according to claim 1, wherein the concave structure further comprises:

a coil supporting plane, the magnetic sheet coil is disposed on the coil supporting plane, and the coil supporting plane conducts the heat of the magnetic sheet coil to the lower housing assembly.

* * * * *